United States Patent
Gwo et al.

(10) Patent No.: US 8,835,903 B2
(45) Date of Patent: Sep. 16, 2014

(54) LIGHT-EMITTING DIODE DISPLAY AND METHOD OF PRODUCING THE SAME

(75) Inventors: Shang-Jr Gwo, Hsinchu (TW); Yu-Jung Lu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 13/471,329

(22) Filed: May 14, 2012

(65) Prior Publication Data

US 2012/0223289 A1 Sep. 6, 2012

Related U.S. Application Data

(63) Continuation-in-part of application No. 13/335,199, filed on Dec. 22, 2011, now Pat. No. 8,669,128, which is a continuation-in-part of application No. 12/846,443, filed on Jul. 29, 2010, now Pat. No. 8,242,523.

(51) Int. Cl.
| | |
|---|---|
| H01L 33/04 | (2010.01) |
| H01L 21/00 | (2006.01) |
| H01L 27/15 | (2006.01) |
| B82Y 20/00 | (2011.01) |
| B82Y 30/00 | (2011.01) |
| H01L 33/18 | (2010.01) |
| H01L 33/00 | (2010.01) |
| H01L 33/08 | (2010.01) |
| H01L 33/20 | (2010.01) |
| H01L 33/38 | (2010.01) |

(52) U.S. Cl.
CPC ............... *H01L 27/156* (2013.01); *B82Y 20/00* (2013.01); *B82Y 30/00* (2013.01); *H01L 33/007* (2013.01); *H01L 33/08* (2013.01); *H01L 33/18* (2013.01); *H01L 33/20* (2013.01); *H01L 33/38* (2013.01)
USPC .............................................. 257/13; 438/22

(58) Field of Classification Search
CPC ..... H01L 27/156; H01L 27/153; H01L 27/15; H01L 33/18; H01L 33/007; H01L 33/38; H01L 33/075; H01L 33/08; H01L 33/20; B82Y 30/00; B82Y 20/00
USPC ....... 257/13, 88, 89, E33.005; 438/22, 34, 35
See application file for complete search history.

(56) References Cited

U.S. PATENT DOCUMENTS

| | | | |
|---|---|---|---|
| 2005/0194598 A1 | 9/2005 | Kim et al. | |
| 2008/0308820 A1* | 12/2008 | Louwsma et al. | 257/89 |
| 2009/0302331 A1* | 12/2009 | Smith et al. | 257/88 |

OTHER PUBLICATIONS

Kishino et al., "InGaN/GaN Nanocolumn LEDs Emitting from Blue to Red", 2007, Proc. of SPIE, vol. 6473, pp. 64730T-1-64730T-12, Feb. 8, 2007.*

(Continued)

*Primary Examiner* — Nikolay Yushin
(74) *Attorney, Agent, or Firm* — Muncy, Geissler, Olds & Lowe, P.C.

(57) ABSTRACT

This invention relates light-emitting diode displays with simple structure and fabricating method as well as excellent efficiency. In an embodiment, the display features a nanorod LED array arranged on a substrate and divided into a first, second, and third sub-pixels. Two electrodes are preferably arranged in a vertical configuration for driving the sub-pixels. In another embodiment, a method features the sub-pixels for emitting multi-primary colors being formed on a conductive substrate and thus simplifies the steps.

25 Claims, 18 Drawing Sheets

(56) References Cited

OTHER PUBLICATIONS

Nee et al., "Effect of multiquantum barrier on performance of InGaN/GaN multiple-quantum-well light-emitting diodes", 2007, Journal of Applied Physics, vol. 102, pp. 033101-1-033101-7, Aug. 2, 2007.*

E.F. Schubert, Light-Emitting Diodes, Second Edition, Cambridge, Dec. 2006; p. 90.*

Schubert, E. F. & Kim, J. K., "Sold-state light sources getting smart," *Science*, May 27, 2005, pp. 1274-1278, vol. 308.

Krames, M. R., Shchekin, O. B., Mueller-Mach, R., Mueller, G. O., Zhou, L., Harbers, G. & Craford, M. G.,"Status and future of high-power light-emitting diodes for solid-state lighting," *J. Disp. Technol.*, Jun. 2007, pp. 160-175, vol. 3—No. 2.

Mukai, T., Yamada, M. & Nakamura, S., "Characteristics on InGaN-based uv/blue/green/amber/red light-emitting diodes," *Jpn. J. Appl. Phys.*, Jul. 1999, pp. 3976-3981, vol. 38.

Xu, T., Nikiforov, A. Yu., France, R., Thomidis, C., Williams, A. & Moustakas, T. D., "Blue-green-red LEDs based on InGaN quantum dots grown by plasma-assisted molecular beam epitaxy." Phys. Stat. Sol. A, 2007, pp. 2098-2102, vol. 204.

Humphreys, C. J., "Solid-state lighting," *MRS Bull.*, Apr. 2008, pp. 459-470, vol. 33.

Fiorentini, V., Bernardini, F., Della Sala, F., Di Carlo, A. & Lugli, P., "Effects of macroscopic polarization in III-V nitride multiple quantum wells," *Phy. Rev. B*, Sep. 15, 1999, pp. 8849-8858, vol. 60—No. 12.

Waltereit, P., Brandt, O., Trampert, A., Grahn, H. T., Menniger, J., Ramsteiner, M., Reiche, M. & Ploog, K. H., "Nitride semiconductors free of electrostatic fields for efficient white light-emitting diodes," *Nature*, Aug. 24, 2000, pp. 865-868, vol. 406.

Masui, H., Nakamura, S., DenBaars, S. P. & Mishra, U. K., "Nonpolar and semipolar III-nitride light-emitting diodes: Achievements and challenges," *IEEE Trans. Electron Devices*, Jan. 2010, pp. 88-100, vol. 57—No. 1.

Li et al. "Formation of GaN nanorods by a sublimation method", 2000, Journal of Crystal Growth, vol. 213, pp. 408-410.

Yan, C.-Y., Dai, J.-J., Jiang, R.H., Zheng, J. H., Lin, C.-F., Kuo H.C., Wang, S.-C., "Fabricated nano-disk InGaN/GaN multiquabtum well of the inverse hexagonal pyramids," Journal of Physics and Chemistry of Solids 69 (2008) 589-596.

Chen, H.-Y., Lin, H.-W., Shen, C.-H. & Gwo, S., "Structure and photoluminescence properties of epitaxially oriented GaN nanorods grown on Si(111) by plasma-assisted molecular-beam epitaxy." *Appl. Phys. Lett.*,2006, pp. 243105-1-243105-3,vol. 89.

Schubert, E.F., *Light-Emitting Diodes*, 2006, p. 88 and 90, Second Edition, Cambridge.

Nakamura et al., *The Blue Laser Diode: The Complete Story*, 2000, p. 217, Second Edition, Springer, Berlin.

* cited by examiner

LIGHT-EMITTING DIODE DISPLAY AND METHOD OF PRODUCING THE SAME

CROSS REFERENCE TO RELATED APPLICATIONS

This application is a continuation-in-part of co-pending application Ser. No. 13/335,199, filed Dec. 22, 2011 and entitled "III-nitride light-emitting diode and method of producing the same," which is a continuation-in-part of co-pending application Ser. No. 12/846,443, filed Jul. 29, 2010 and entitled "III-nitride light-emitting diode and method of producing the same," the entire contents of the foregoing applications are incorporated herein by reference.

BACKGROUND OF THE INVENTION

1. Field of the Invention

The present invention relates to light-emitting diode displays and their forming methods.

2. Description of the Prior Art

Conventional full-color light-emitting diode (LED) displays employ red, green, and blue light-emitting diodes functioning as red, green, and blue light-emitting sub-pixels, respectively, and a color image is displayed according to the combination of emissions of these three types of sub-pixels.

The development of full-color light-emitting diode displays has many challenges to be overcome. For example, a challenge is related to the complicated and costly manufacturing process. The light-emitting diodes are typically grown on separate substrates, and they need to be transferred to a display substrate. The transfer is a difficult process due to the vast number of light-emitting diodes. For instance, the number of sub-pixels or the number of the light-emitting diodes of a 40-inch diagonal full HD (high definition) full-color display equals 1920×1080×3. Accordingly, there are 6,220,800 light-emitting diodes needed to be transferred and many of them may fail during the transfer.

In addition, because currently it is difficult to produce InGaN-based or AlGaInP-based light-emitting diodes on a substrate with a diameter more than 2 or 3 inches, red, green, and blue light-emitting diodes are usually formed in two or three individual substrates. A desired number of red, green, and blue LED diodes are then transferred and mounted to a single package to form a surface-mounted device (SMD), which is then mounted on a printed-circuit board.

Further, for driving the pixels, wire-bonding steps are usually needed to electrically connect the light-emitting diodes with the printed-circuit board or the display substrate.

Furthermore, the emitting efficiency, brightness, and other properties of LED displays are based on a hybrid approach or typically unsatisfactory.

Therefore, it would be advantageous to provide novel LED displays with improved configuration and manufacturing method as well as better performance.

SUMMARY OF THE INVENTION

An object of the present invention is to provide light-emitting diode displays with improved configuration and manufacturing method.

An embodiment of this invention provides a light-emitting diode display comprising a substrate and a plurality of pixels arranged on the substrate. Each pixel comprises a first, a second, and a third sub-pixel, and each sub-pixel comprises one or more first, second, or third light-emitting diodes for emitting a first, a second, or a third color. Each of the first, second, and third light-emitting diode comprises: a first electrode; a first doped nanorod in ohmic contact with the first electrode; an active light-emitting region arranged on the first doped nanorod; a second doped nanorod arranged on the active light-emitting region; and a second electrode arranged on the second doped nanorod.

Another embodiment of this invention provides a method for producing a light-emitting diode display, the method comprising the steps of (1) providing a conductive substrate; (2) forming a plurality of first doped nanorods on the substrate; (3) forming an integral first electrode or a plurality of individual first electrodes to form ohmic contact with the first doped nanorods via the conductive substrate; (4) forming a first active light-emitting region on each of a plurality of first top surfaces of the first doped nanorods; (5) forming a second active light-emitting region on each of a plurality of second top surfaces of the first doped nanorods; (6) forming a third active light-emitting region on each of a plurality of third top surfaces of the first doped nanorods; (7) forming a second doped nanorod on each of the first, second, and third light-emitting regions; (8) forming a second electrode on each second doped nanorod; wherein the first, second, and third light-emitting diode respectively emit a first, a second, and a third color when voltages are supplied to the integral first electrode or the plurality of first electrodes and supplied to the second electrode.

BRIEF DESCRIPTION OF THE DRAWINGS

FIG. 1c is a micro-EL image (20 mA) under a 100× objective revealing full-visible-spectrum emissions from the white LED shown in FIG. 1a.

DESCRIPTION OF THE PREFERRED EMBODIMENT

Reference will now be made in detail to specific embodiments of the invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known process operations and components are not been described in detail in order not to unnecessarily obscure the present invention. While drawings are illustrated in details, it is appreciated that the quantity of the disclosed components may be greater or less than that disclosed, except expressly restricting the amount of the components. Wherever possible, the same or similar reference numbers are used in drawings and the description to refer to the same or like parts.

The primary object of the present invention can be achieved by using self-assembled GaN nanorod arrays on Si substrates as templates for growing strain-free InGaN/GaN nanorod heterostructures. The most salient feature of the nanorod-based approach is the absence of piezoelectric polarization effects, allowing thick (tens of nm) InGaN nanodisk emitter structures in the full visible range. By using this approach, the present invention demonstrates both monolithic, phosphor-free white (polychromatic) nanorod-array LEDs and polarized full-color (monochromatic) single-nanorod LEDs.

A phosphor-free white, polychromatic nanorod-array LEDs according to a preferred embodiment is described below. Vertically self-aligned GaN nanorod arrays were grown along the wurtzite c-axis on 3-inch, n-type Si(111) substrates by plasma-assisted molecular-beam epitaxy (PAMBE) [Chen, H.-Y., Lin, H.-W., Shen, C.-H. & Gwo, S. Structure and photoluminescence properties of epitaxially oriented GaN nanorods grown on Si(111) by plasma-assisted molecular-beam epitaxy. *Appl. Phys. Lett.* 89, 243105 (2006)]. The PAMBE-grown GaN nanorod arrays exhibit the properties of strain- and dislocation-free single crystals, which can be used as nanostructured compliant templates for growing strain-free InGaN nanodisks.

Figure 1A:
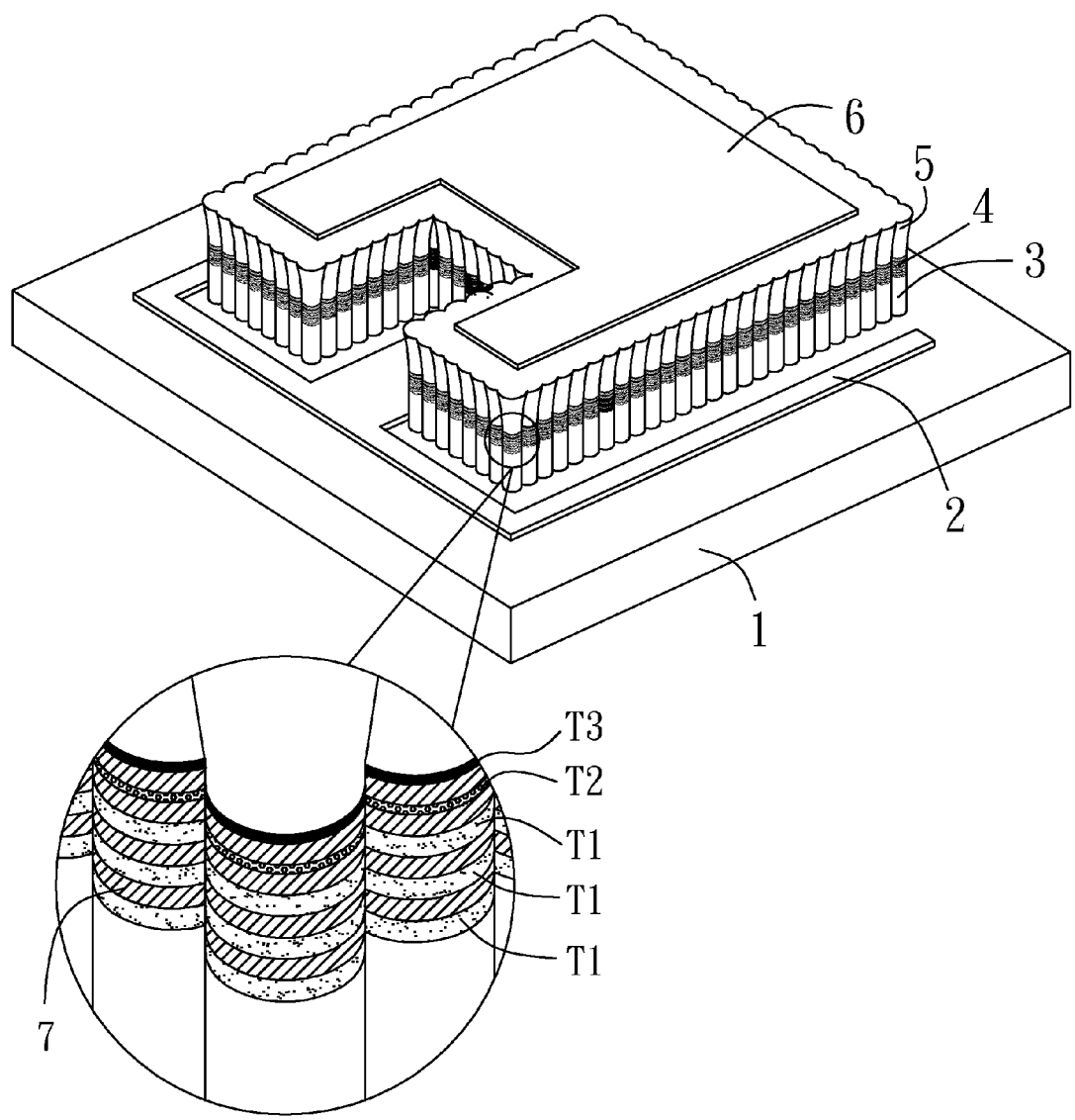
FIG. 1a is a schematic diagram of LED structure for generating white light according to an embodiment of the present invention.
Figure 1B:
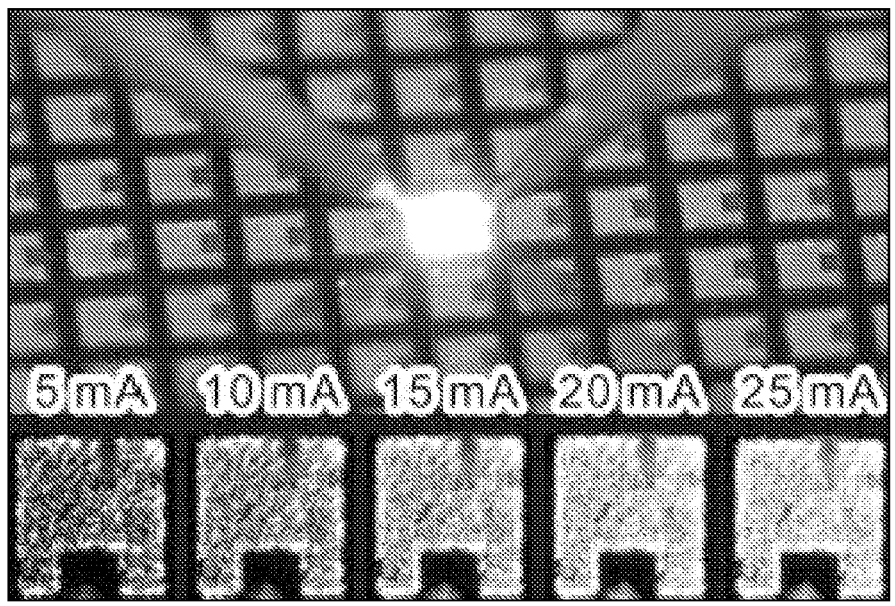
FIG. 1b is a photograph of LED of FIG. 1a, which emits white light with 20 mA injection current, and micro-electroluminescence (EL) images shown below are acquired under a 10× objective at various injection currents.
Figure 1C:
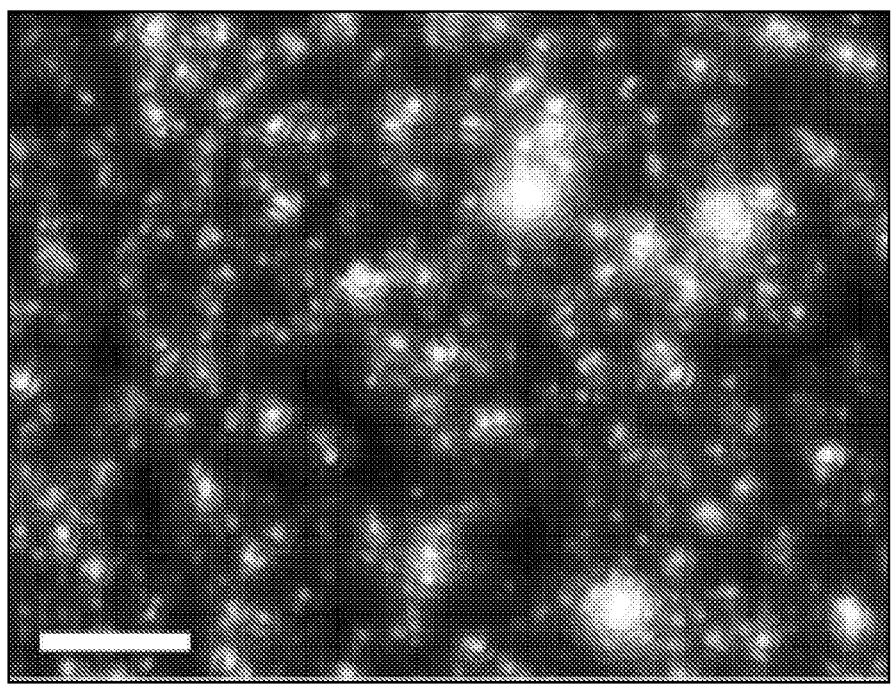
Figure 1D:
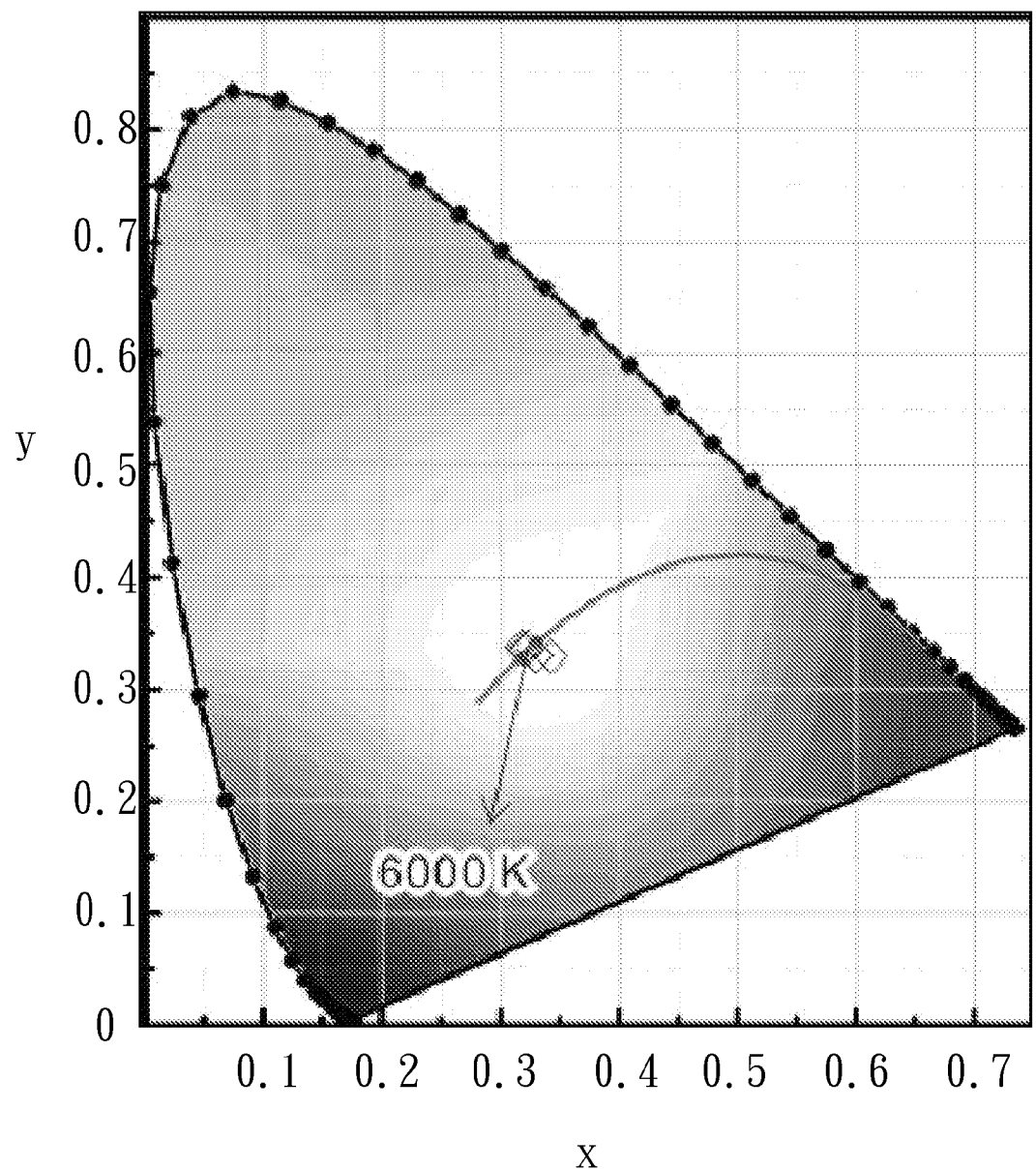
FIG. 1d is Commission international de l'Éclairage (CIE) 1931 chromaticity coordinates of LED of FIG. 1a with injection currents from 5 mA to 25 mA.

FIGS. 1a to 1d show a light-emitting diode according to a preferred embodiment of the present invention, where FIG. 1a is a schematic diagram of nanorod-array LED structure for generating white light; FIG. 1b is a photograph of nanorod-array LED emitting white light at 20 mA injection current, and micro-electroluminescence (EL) images shown below are acquired under a 10× objective at various injection currents; FIG. 1c is a micro-EL image (20 mA) under a 100× objective revealing full-visible-spectrum emissions from the white LED shown in the photograph with scale bar: 10 µm, and FIG. 1d is Commission international de l'Éclairage (CIE) 1931 chromaticity coordinates at injection currents from 5 mA to 25 mA in which the correlated color temperature (shown on the Planckian locus) maintains at near 6000 K (natural white light) for injection currents larger than 5 mA.

As shown in FIG. 1a, the light-emitting diode of the embodiment primarily includes a n-type silicon substrate 1, a Ti/Au electrode 2 disposed on the silicon substrate 1, a n-type gallium nitride (GaN) nanorod array 3 consisted of n-type GaN nanorods ohmic contact with the Ti/Au electrode 2, one or more indium gallium nitride (InGaN) nanodisks 4 disposed on each of the n-type GaN nanorod 3, a p-type GaN nanorod array 5 consisted of p-type GaN nanorods disposed on top of the InGaN nanodisks 4 where one p-type GaN nanorod corresponds to one n-type GaN nanorod, and a Ni/Au electrode 6 ohmic contacting with the p-type GaN nanorod array 5. Notice that the Ti/Au electrode 2 may not directly contact but form an ohmic contact to the n-type GaN array 3 via the silicon substrate 1. In addition, Ni/Au electrode 6 is transparent, and each of the p-type GaN nanorods 5 has two ends in which the end near the transparent electrode 6 may be wider than the other end. This structure is helpful to prevent formation of leakage current channels. The first electrode 1 may also be patterned so as to control the emitting area if necessary.

The white-light emission is realized by a stack of nanodisks 4 embedded in the GaN nanorod p-n junction 3/5 for the desired light mixing effects. It is important to know that each array of InGaN nanodisk contains a continuous distribution of emitters at different wavelengths, while the average emission wavelength can be controlled by growth temperature T and In/Ga beam fluxes. In this embodiment, the light-emitting diode contains three T1 InGaN nanodisks, one T2 InGaN nanodisk, and one T3 InGaN nanodisk, and the growth temperatures for T1, T2, and T3 are $T_1 > T_2 > T_3$. Notice that in other embodiments of the present invention, the number of the InGaN nanodisks including T1, T2, and T3 is not limited. In addition, a GaN barrier layer 7 is interposed between each two of the InGaN nanodisks 4. For conventional planar InGaN/GaN multiple quantum well structures, the InGaN active layer thickness has been limited to about 2-4 nm. Here, the embodiment takes full advantage of the strain-free nanodisk structure to stack nanodisks with varying thicknesses (for example, each InGaN nanodisk has a thickness about 10-25 nm). Furthermore, the number and position (with respect to the p-GaN region) of nanodisks are very important to obtain the appropriate light mixing conditions for natural white emission (FIG. 1b). The thick InGaN nanodisks employed here provide larger and tunable active region volumes as well as improved carrier capture with reduced electron overflow at high currents. As will be shown later, the thick nanodisks can also lead to a solution to efficiency droop phenomenon. Additionally, the full-color emissions shown in FIG. 1c demonstrate a unique opportunity to fabricate nanorod-array LEDs with high color rendering capability. For the phosphor-based white LEDs, high color rendering would require a wide array of novel full-color phosphors, which will be a daunting task because of the required temperature stability, quantum efficiencies, and chemical robustness.

Figure 2A:
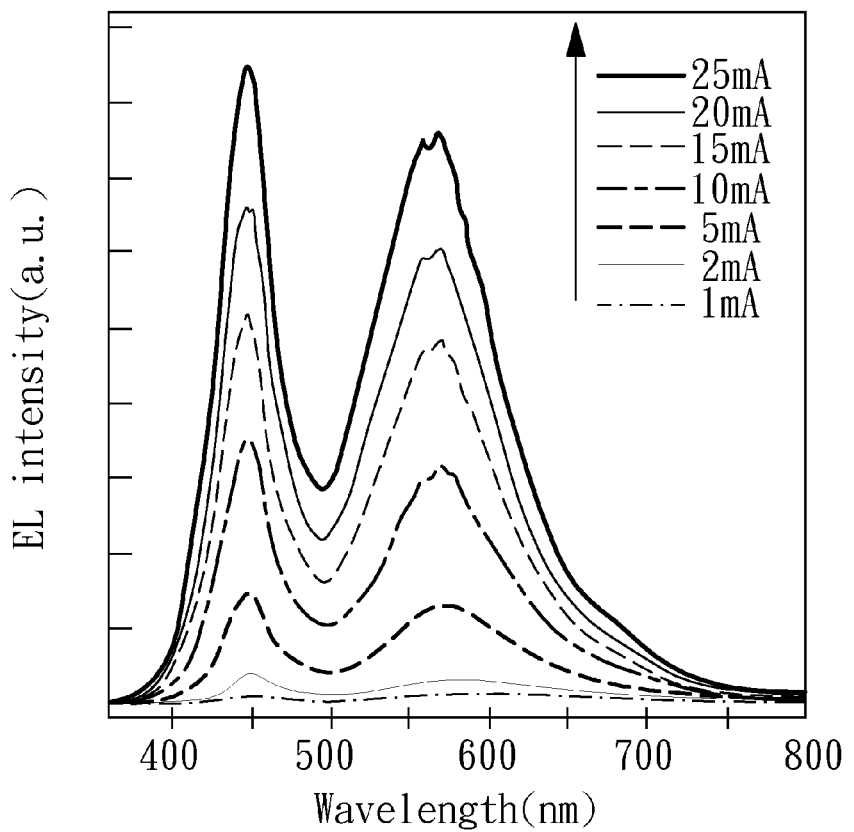
FIG. 2a is an electroluminescence (EL) spectra of InGaN/GaN nanorod-array white LED at injection currents from 1 mA to 25 mA according to the embodiment of the present invention.

FIG. 2a is an electroluminescence (EL) spectra of InGaN/GaN nanorod-array white LED at injection currents from 1 mA to 25 mA according to the preferred embodiment of the present invention. Two major peaks can be clearly identified at 448 nm (blue-band) and 569 nm (yellow-band) at 20 mA. The spectral blue shift with increasing current is negligibly small from 5 mA to 25 mA. This behavior illustrates that the QCSE is insignificant in InGaN nanodisk emitters. While full-color emissions are observed in the micro-EL image (FIG. 1c), two major peaks resulting from $T_1$ (blue-band) and $T_2$ (yellow-band) nanodisk arrays can be clearly identified, note that the contribution from the $T_3$ nanodisk array (extending into the red region) is weaker and mixed within the yellow-band. Both blue and yellow emission bands show negligibly small spectral blue shifts with increasingly current by 5-25 mA. From these EL spectra, it can be understood that the light mixing of blue- and yellow-band causes the white light emission shown in FIG. 1b. The small spectral blue-shifts with increasing current indicate insignificant polarization effects in the InGaN nanodisk emitters, which in turn results in the drive-current-insensitive correlated color temperatures measured for the nanorod-array white LED (FIG. 1d).

At present, the efficiency droop phenomenon of InGaN LEDs at high injection current densities is considered the major obstacle hindering high-brightness LEDs for general illumination applications. The embodiment of the present invention provides the thick and strain-free InGaN/GaN nanorod heterostructures that can overcome the efficiency droop phenomenon.

Figure 2B:
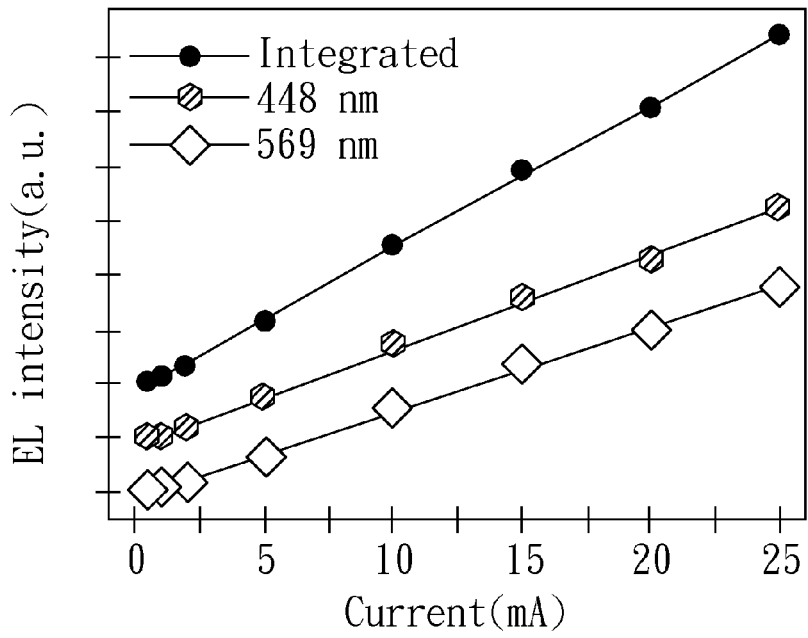
FIG. 2b shows plots of integrated and individual EL intensities at two major peaks shown in FIG. 2a as functions of injection current.

FIG. 2b shows plots of EL intensity of integrated LED and EL intensity at two specific wavelengths of two major peaks in FIG. 2a as functions of injection current. Both the blue- and yellow-band intensities increase monotonically with increasing injection current at a constant slope, resulting in drive-current-insensitive white light emission. In addition, the integrated EL shows no sign of intensity degradation.

Although the injection current was tested only up to 25 mA (~53 A/cm$^2$ in current density), the actual current density passing through individual nanorod can be very high. To measure the maximum current density before the onset of efficiency droop, another embodiment provides a single-nanorod LED and its electrical and optical characterization.

Figure 3A:
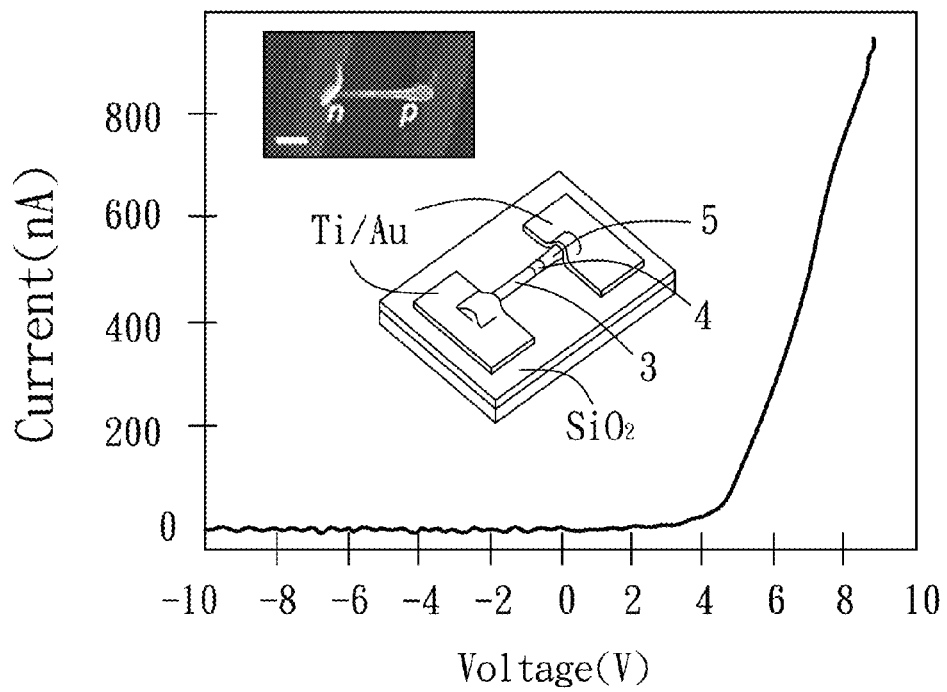
FIG. 3a is I-V curve of a single InGaN/GaN nanorod LED at room temperature according to an embodiment of the present invention.

FIG. 3a is I-V curve of a single InGaN/GaN nanorod LED at room temperature according to an embodiment of the present invention. No leakage current can be found at −10 V. Inset shows the field-emission scanning electron microscopy (FE-SEM) image and schematic diagram of the measured nanorod structure in which the rod length is about 2 µm. The single-nanorod LED includes only one InGaN nanodisk 4 with 90 nm in diameter and 40 nm in thickness. Scale bar indicates 500 nm. The measured I-V characteristics show a good diode behavior. Especially, single-nanorod diode show no signs of leakage currents, which allows for the measurement of actual current density passing through a single InGaN/GaN nanorod.

Figure 3B:
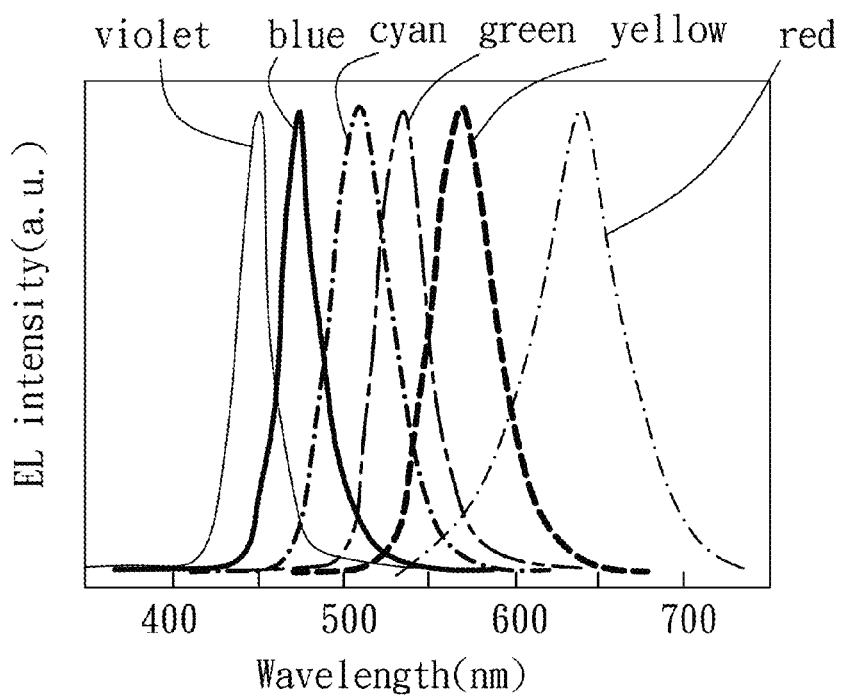
FIG. 3b shows normalized EL spectra of some single InGaN/GaN nanorod LEDs provided by embodiments of the present invention in which each single InGaN/GaN nanorod LED contains a single InGaN nanodisk.

FIG. 3b show normalized EL spectra of some single InGaN/GaN nanorod LEDS provided by embodiments of the present invention in which each single InGaN/GaN nanorod LED contains single InGaN nanodisk. The spectra show that the emissions from single InGaN nanodisks are monochromatic with narrow spectral widths (~25 nm). The corresponding optical microscopy images (not shown) of the diffraction-limited light emissions from single InGaN/GaN nanorod LEDs under forward bias current by 500 nA show color of violet, blue, cyan, green, and yellow, respectively.

Figure 3C:
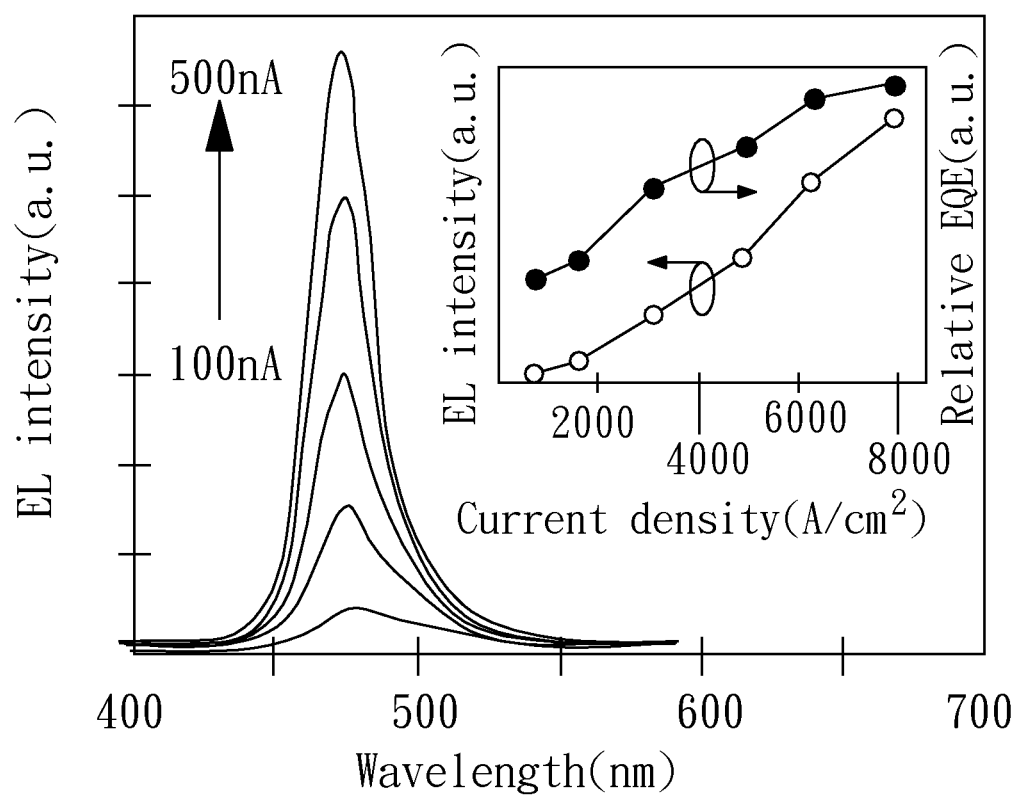
FIG. 3c shows EL spectra of the single InGaN/GaN nanorod LED shown in FIG. 3a emitting at 475 nm with increasing injection currents from 100 nA to 500 nA.

FIG. 3c shows EL spectra of a single InGaN/GaN nanorod LED emitting at 475 nm with injection currents from 100 nA to 500 nA. The single InGaN/GaN nanorod LED is the same diode measured in FIG. 3a. The acquired relations of EL intensity and relative external quantum efficiency (EQE) with respect to the injection current are shown in the inset. The relative EQE is estimated by EL intensity divided by the injection current and was measured by using a fixed emission collection geometry under DC injection mode. The relative EQE plot shows a trend of monotonic increase with increasing current density. In contrast, for conventional LEDs, this behavior holds only for current densities <10 A/cm$^2$. Using the known diameter (90 nm) of the nanorod, the maximum current density without showing efficiency degradation can be directly estimated to be 8,000 A/cm$^2$. This current density is extremely high in comparison with ~10 A/cm$^2$ for typical InGaN LEDs and ~200 A/cm$^2$ for an InGaN LED with a thick InGaN active layer. This high current density in single-nanorod LEDs without efficiency degradation is made possible by the thick (40 nm) and strain-free nanodisk structure employed in the present invention.

Figure 4A:
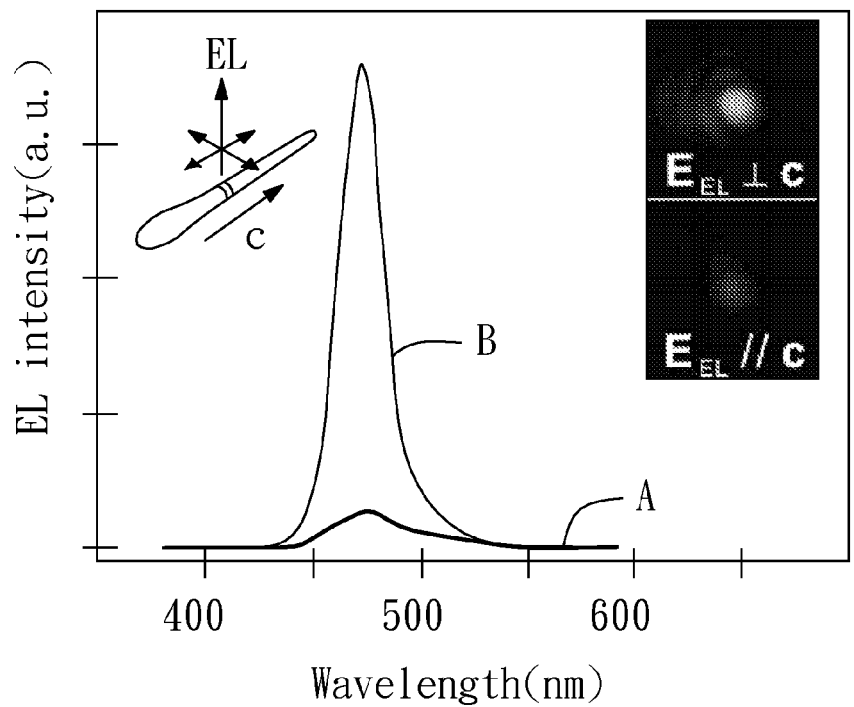
FIG. 4a shows polarized EL spectra of the single InGaN/GaN nanorod LED shown in FIG. 3a emitting at 475 nm. The injection current was set at 500 nA.

For some display applications, such as backlight displays, it is desirable to have polarized light emission from LEDs for improved system efficiencies. For nonpolar m-plane InGaN LEDs, there are already reports of large in-plane emission anisotropy, leading to possible backlighting applications in liquid crystal displays. In contrast, conventional polar c-plane InGaN LEDs exhibit no such properties. Here the present invention shows that the EL emission from polar nanorod heterostructures of the embodiments can be highly polarized. FIG. 4a show polarized EL spectra of a single InGaN/GaN nanorod LED (the same structure shown in FIG. 3a) at 500 nA injection current. These spectra were recorded with the emission polarization oriented parallel (curve A, $E_{EL}$//c) and perpendicular (curve B, $E_{EL} \perp c$) to the nanorod axis (the c-axis of the wurtzite crystal structure). The polarization ratio ρ is defined as $\rho = (I_\parallel - I_\perp)/(I_\parallel + I_\perp)$, where $I_\parallel$ and $I_\perp$ are the EL intensities corresponding to the electric fields of EL ($E_{EL}$) parallel and perpendicular to the c-axis (the nanorod axis), respectively. The measured polarization ratio is −0.85. The insets of FIG. 4a show the corresponding optical microscopy images under a 100× objective.

Figure 4B:
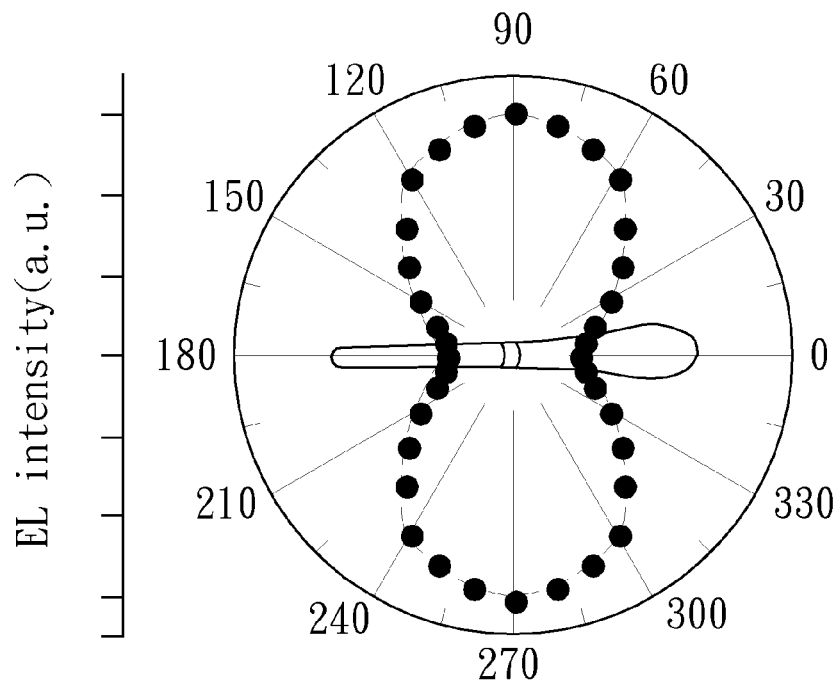
FIG. 4b shows the measured polar plot of integrated EL of the single InGaN/GaN nanorod LED shown in FIG. 3a emitting at 475 nm in which the linearly polarized EL intensity is plotted as a function of the emission polarization with respect to the nanorod long axis.

FIG. 4b shows the measured polar plot of linearly polarized EL intensity as a function of the emission polarization with respect to the nanorod long axis. A measured polarization ratio of −0.85 represents a high degree of EL polarization, as evidenced in FIG. 4b. Unlike most of the polarized emission from nanorod or nanowire luminescent materials, the observed EL anisotropy is oriented perpendicular to the nanorod axis (a negative ρ value). A previous study has identified that the optical confinement effect in single GaN nanorods (<100 nm in width) is the cause of polarized luminescence. In this mechanism, the polarization ratio is a function of emission wavelength and nanorod diameter. On the contrary, experiments of the present invention show that the polarized luminescence with negative ρ is from the InGaN nanodisk structure embedded in the GaN nanorod. Additionally, the measured negative values of ρ show weak dependences on the emission wavelength or diameter of the InGaN nanodisks. This behavior is very favorable for future applications requiring polarized light emission.

In summary, using both nanorod-array and single-nanorod LEDs, the present invention demonstrates that the LED device structure based on thick and strain-free InGaN nanodisk emitters embedded in the self-assembled GaN nanorods can overcome the existing white LED technology limitations, such as the green-yellow gap and the efficiency degradation phenomenon under high-power operation. These devices do not require special nanofabrication techniques and have excellent scaling capability on Si substrates. In addition, the high flexibility in designing InGaN nanodisk emitter structures allows further device optimization for novel lighting and display applications.

Example of Producing White-Light InGaN/GaN Nanorod-Array LEDs.

The InGaN/GaN nanorod array samples were grown on 3-inch, P-doped n-type Si(111) (resistivity: 0.001-0.005 Ωcm) wafers by nitrogen-plasma-assisted molecular beam epitaxy (PAMBE) under nitrogen-rich conditions, in comparison to the group-III/nitrogen flux ratio used for III-nitride film growth. The custom-made PAMBE system (DCA Instruments, DCA-600) is equipped with a large radio-frequency nitrogen plasma source (ADDON). The nitrogen plasma source during the growth procedure was at a nitrogen gas flow rate of 3 sccm (standard cubic centimeter per minute) under 500 W RF forward power. The in-situ reflection high energy electron diffraction (RHEED) observation confirms that the PAMBE-grown nanorods are wurtzite-type single crystals (the nanorod axial growth direction is along the wurtzite c-axis). The in-plane crystallographic axes of the nanorods are found to be the following epitaxial relation: $<2\bar{1}\bar{1}0>\|[\bar{1}10]_{Si}$; $<1\bar{1}00>\|[11\bar{2}]_{Si}$. Prior to the InGaN nanodisk growth, Si-doped n-type GaN nanorod array (~1 μm in height) was grown first on the Si(111) substrate at 770° C. (growth temperature) [Ga beam equivalent pressure ($BEP_{Ga}$): $9\times10^{-8}$ Torr]. Subsequently, InGaN nanodisks were grown on top of the n-type GaN nanorods. The emission wavelengths of InGaN nanodisks were controlled by the growth temperature (T) and group-III beam fluxes. In FIG. 1a, three nanodisk growth temperature are $T_1>T_2>T_3$ ($T_1$: 705° C., $T_2$: 700° C., $T_3$: 690° C.). In this structure, which was used for fabricating nanorod-array white LEDs, three $T_1$ nanodisks ($BEP_{Ga}$: $7.5\times10^{-8}$ Torr; $BEP_{In}$: $2.6\times10_{-8}$ Torr; thickness of InGaN/GaN: ~25 nm/25 nm), one $T_2$ nanodisk ($BEP_{Ga}$: $6.2\times10^{-8}$ Torr; $BEP_{In}$: $3.3\times10^{-8}$ Torr; thickness of InGaN/GaN: ~10 nm/25 nm), and one $T_3$ nanodisk ($BEP_{Ga}$: $5.7\times10^{-8}$ Torr; $BEP_{In}$: $3.7\times10^{-8}$ Torr; thickness of InGaN/GaN ~15 nm/25 nm) were used to generate the white light emission. The thickness of each InGaN nanodisk ranges from 10 to 25 nm, and the GaN barrier thickness is fixed at 25 nm, as shown schematically in FIG. 1a. On top of the $T_3$ InGaN nanodisk, Mg-doped p-type GaN nanorods (~1 μm in height) were grown at 690° C. The Ga/N flux ratio was then gradually increased to induce lateral growth of p-type GaN nanorods, thereby forming a quasi-continuous p-type GaN top film.

White LED devices were fabricated first by dry etching technique (inductively coupled plasma, ICP) to form mesas of 260×280 μm² in size (effective current passing area: ~47, 100 μm²). For the purpose of LED isolation, the exposed GaN nanorod part was etched into the Si substrate using a $SiO_2$ etch mask. Contact metals were then evaporated in a $10^{-7}$ Torr vacuum. The ohmic contact to n-type Si (111) and p-type GaN layers are Ti/Au (60 nm/40 nm) and Ni/Au (15 nm/35 nm). The Ni/Au top contact was thin enough to be transparent for the emitted light. In other examples, the electrodes may be made of other materials, such as indium tin oxide (ITO) or other materials known in the art.

Example of Producing Monochromatic InGaN/GaN Single-Nanorod LED.

The InGaN/GaN single-nanorod LED structure used in the present invention was grown on a 3-inch, n-type Si (111) wafer by PAMBE. First, 1.2 μm, n-type GaN nanorods were grown at 770° C., and then 40-nm-thick InGaN nanodisks were grown on top of the n-type GaN nanorods ($BEP_{Ga}$:$3.5\times10^{-8}$ Torr; $BEP_{In}$: $2.6\times10^{-8}$ Torr) at 705° C. Finally, 800 nm, p-type GaN nanorods were grown on top of the InGaN nanodisks at 685° C.

After PAMBE growth, this sample was dipped in 1% hydrogen fluoride (HF) solution for 30 seconds to remove native oxide covered on the nanorods. Then the samples were suspended in isopropanol solution with sonic bath and later were dispersed onto an oxidized (~500-nm-oxide covered) silicon substrate. The electrodes were patterned by a standard photolithography and lift off process. Both of the ohmic contacts to n-type and p-type electrodes are Ti/Au (20 nm/35 nm). Contact metals were electron-beam evaporated in a vacuum chamber and the base pressure was in the $10^{-7}$ Torr range. After the contact evaporation process, the LED devices were thermal annealled at 600° C. for 20 seconds in a vacuum chamber with the base pressure in the $10^{-9}$ Torr range.

For a person skilled in the art, modifications, alternatives, equivalents, and variations may be made to the above-mentioned embodiments and should be within the scope of this invention. For example, although the LED structure shown in FIG. 1a is a horizontal type of LED structure for illustrative purpose, it can be other types, such as a vertical type. In addition, other substrates may be employed instead of the silicon substrate. In addition, contact electrodes may be made of other materials or composite materials and may have other configurations and positions. Further, the LED structure may be transferred to another substrate, such as a metal substrate, a plastic substrate, a printed circuit board, a transparent substrate, or other substrates for various purposes. Furthermore, alternative methods known in the art may be used to replace with one or more steps of the above-mentioned fabricating method. Moreover, the substrate may be p-type doped and the position of p-type and n-type GaN nanorod array 3/5 may be interchanged. Moreover, the terms "GaN" and "InGaN" used in this specification may refer to "GaN-based" and "InGaN-based"; the elements of which may be slightly varied or modified. For instance, InGaN may be replaced by AlInGaN and GaN may be replaced by AlGaN, etc.

Figure 5A:
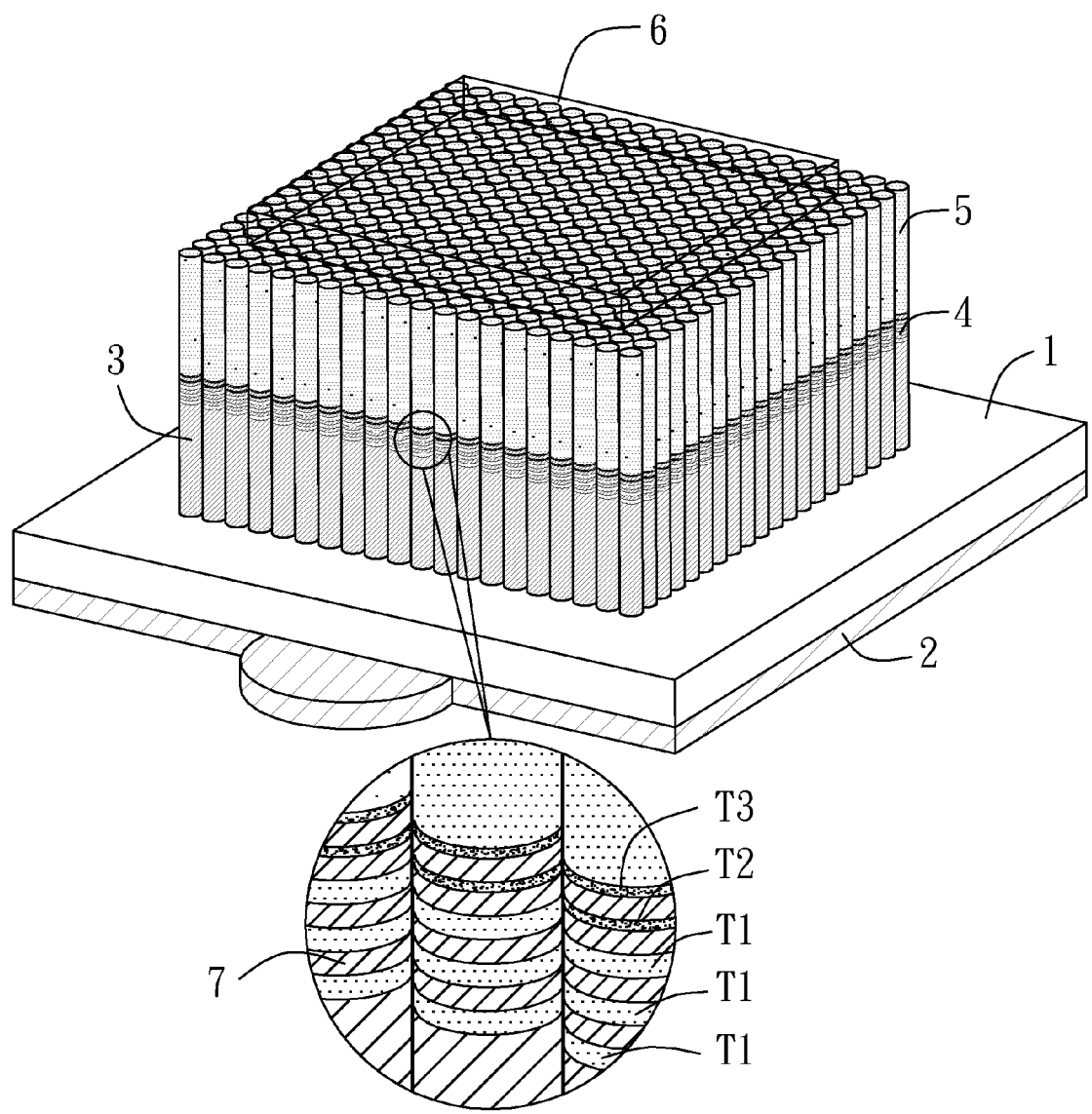
FIG. 5a and FIG. 5b are schematic diagrams of LED device for generating white light according to two embodiments of the present invention.

FIG. 5a illustrates a vertical type of LED structure according to another embodiment of this invention. As shown in FIG. 5a, the light-emitting diode structure primarily includes a substrate 1, a first electrode 2, a first doped nanorod array 3, a plurality of active light-emitting regions 4, a second doped nanorod array 5, and a second electrode 6.

For illustrative purpose and preferably, the substrate 1 is an n-type doped silicon substrate; the first electrode 2 is a composite, multi-layered electrode, e.g., a Ti/Au electrode; the first doped nanorod array 3 is an n-type gallium nitride (GaN) nanorod array; each active light-emitting region includes one or more indium gallium nitride (InGaN) nanodisks 4; the second doped nanorod array 5 is an p-type gallium nitride (GaN) nanorod array; and the second electrode 6 is a transparent electrode, e.g., an indium tin oxide (ITO) electrode.

In this preferred embodiment, the first electrode 2 and the first doped nanorod array 3 are disposed on two opposite surfaces of the substrate 1. The first doped nanorod array 3 consists of n-type GaN nanorods ohmic contacting with the first electrode 2 through the substrate 1. The one or more indium gallium nitride (InGaN) nanodisks 4 are disposed on each of the n-type GaN nanorod 3. The p-type GaN nanorod array 5 consists of p-type GaN nanorods disposed on top of the InGaN nanodisks 4 where one p-type GaN nanorod corresponds to one n-type GaN nanorod. The second electrode 6, e.g., the ITO electrode 6 is disposed on and ohmic contacts with the p-type GaN nanorod array 5.

Figure 5B:
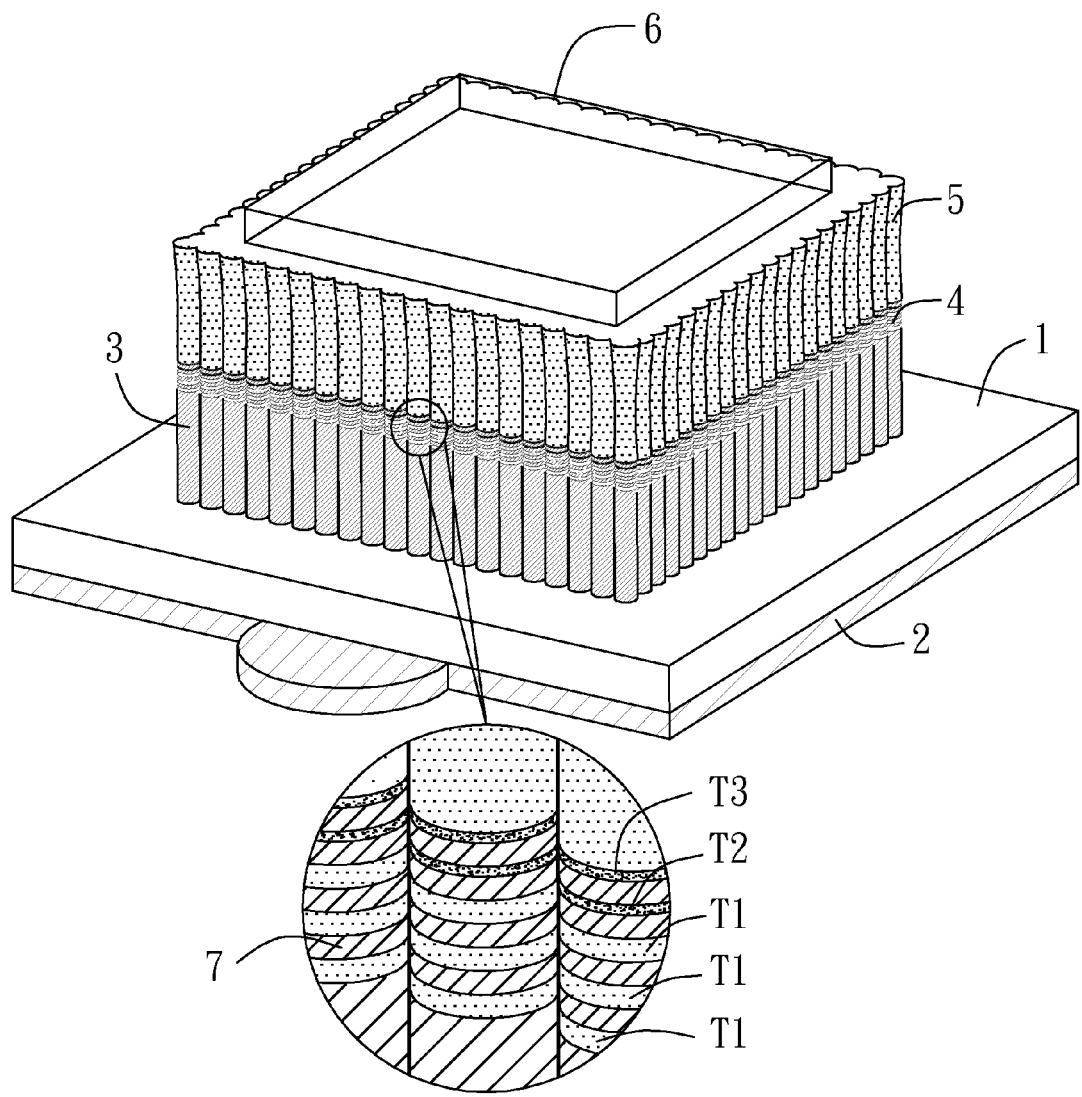

Preferably, the second electrode 6 is patterned and transparent or sufficient thin to be transparent. Further, each of the p-type GaN nanorods 5 and/or each of the n-type GaN nanorods 3 has two ends in which the end near to the transparent electrode 6, i.e., the first end from the transparent electrode 6, may be wider than the other, as shown in FIG. 5b. This structure is helpful to prevent formation of leakage current channels. The first electrode 1 may also be patterned so as to control the emitting area if necessary. Notice that the term "and/or" used in this specification refers to "and" or "or."

As mentioned before, the emitting wavelength, i.e., the emitting color or the desired mixing effect of the LED structure, can be controlled by the number and the emission wavelength of the nanodisk emitters, which is controlled by the growth temperature T and flux ratio of elements, e.g., In/Ga beam flux ratio in the epitaxial process for growing the nanodisks.

As shown in FIG. 1c and FIG. 3b, the emitting color could be full color over all full-visible-spectrum. Referring to FIG. 5a and FIG. 5b, the light-emitting diode contains three T1 InGaN nanodisks, one T2 InGaN nanodisk, and one T3 InGaN nanodisk, and the growth temperatures for T1, T2, and T3 are $T_1 > T_2 > T_3$. In addition, a GaN barrier layer 7 is interposed between each two of the InGaN nanodisks 4. A white-light emission can be achieved by the above-mentioned structure.

The thickness of each nanodisk may range from 10 nm to 25 nm but it may smaller or greater than this range. Besides, modifications, alternatives, equivalents, and variations for the embodiment of FIG. 5a and FIG. 5b are at least the same as the prior embodiment shown in FIG. 1a.

According to another embodiment of this invention, FIG. 6a to FIG. 6f illustrate a method to fabricate a vertical type of LED structure as shown in FIG. 5a.

Figure 6A:
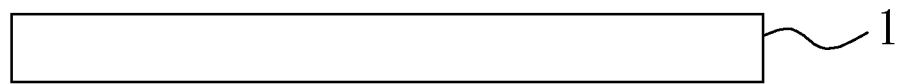
FIG. 6a to FIG. 6f show a method to fabricate the LED structure of FIG. 5a according to another embodiment of the present invention.

Referring to FIG. 6a, a substrate 1 is provided. The substrate 1 may include, but is not limited to, a silicon substrate, a silicon carbide (SiC) substrate, or other semiconductor substrates or other substrates made of other conducting materials. For illustrative purpose, a heavy doped n-type silicon (111) substrate 1 with resistivity 0.001-0.005 Ω cm is used. The substrate 1 may be cleaned by a normal procedure as known in the art. In addition, the substrate 1 may be dipped into a buffered oxide etching (BOE) solution, such as a hydrofluoric acid (HF) or ammonium fluoride (NH4F) aqueous solution, for removing native oxide layer on the surface of the substrate 1.

Figure 6B:

Referring to FIG. 6b, a first electrode 2, such as a Ti/Au electrode 2, is formed on the bottom surface of the substrate 1 by an evaporation method, such as thermal evaporation, electron-beam evaporation, sputtering, or other methods known in the art.

Figure 6C:
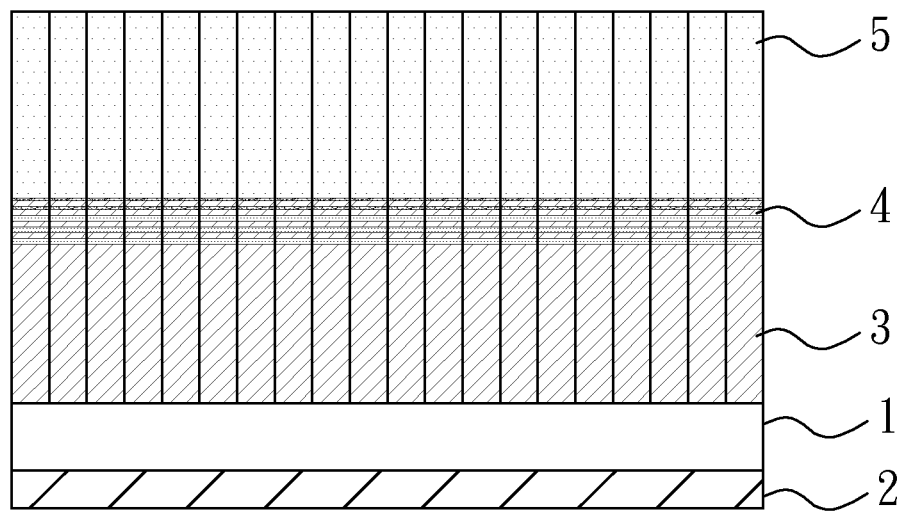

Referring to FIG. 6c, an electroluminescent (EL) structure at least including a first doped nanorod array 3, active light-emitting regions 4, and a second doped nanorod array 5 is formed by an epitaxial process, preferably the mentioned nitrogen-plasma-assisted molecular beam epitaxy (PAMBE). For illustrative purpose and preferably, the first doped nanorod array 3 is an n-type gallium nitride (GaN) nanorod array; each active light-emitting region 4 includes one or more indium gallium nitride (InGaN) nanodisks; and the second doped nanorod array 5 is an p-type gallium nitride (GaN) nanorod array.

The following illustrates a particular example to grow the electroluminescent (EL) structure. The PAMBE process is performed under nitrogen-rich conditions, in comparison to the group-III/nitrogen flux ratio used for III-nitride film growth. The nitrogen plasma source during the growth procedure is at a nitrogen gas flow rate of 3 sccm (standard cubic centimeter per minute) under 500 W RF forward power. The in-situ reflection high energy electron diffraction (RHEED) observation confirms that the grown nanorods are wurtzite-type single crystals, i.e., the nanorod axial growth direction is along the wurtzite c-axis. The in-plane crystallographic axes of the nanorods are found to be the following epitaxial relation: $<2\bar{1}\bar{1}0>\|[\bar{1}10]_{Si}$; $<1\bar{1}00>\|[11\bar{2}]_{Si}$. Prior to the InGaN nanodisk growth, Si-doped n-type GaN nanorod array with about 1 μm in height is grown first on the Si(111) substrate at a growth temperature 770° C. and a Ga beam equivalent pressure ($BEP_{Ga}$) $9 \times 10^{-8}$ Torr. Subsequently, InGaN nanodisks are grown on top of the n-type GaN nanorods. The emission wavelengths of InGaN nanodisks are controlled by the growth temperature (T) and group-III beam fluxes. In the exemplary example of FIG. 5a and FIG. 5b, three nanodisk growth temperature are $T_1 > T_2 > T_3$ ($T_1$: 705° C., $T_2$: 700° C., $T_3$: 690° C.). This structure is used for fabricating white LEDs and the growing conditions are: three $T_1$ nanodisks ($BEP_{Ga}$: $7.5 \times 10^{-8}$ Torr; $BEP_{In}$: $2.6 \times 10^{-8}$ Torr; thickness of InGaN/GaN: ~25 nm/25 nm), one $T_2$ nanodisk ($BEP_{Ga}$: $6.2 \times 10^{-8}$ Torr; $BEP_{In}$: $3.3 \times 10^{-8}$ Torr; thickness of InGaN/GaN: ~10 nm/25 nm), and one $T_3$ nanodisk ($BEP_{Ga}$: $5.7 \times 10^{-8}$ Torr; $BEP_{In}$: $3.7 \times 10^{-8}$ Torr; thickness of InGaN/GaN ~15 nm/25 nm). The thickness of each InGaN nanodisk may range from 10 nm to 25 nm and the GaN barrier thickness may be fixed at 25 nm, as shown schematically in FIG. 5a and FIG. 5b. On top of the $T_3$ InGaN nanodisk, Mg-doped p-type GaN nanorods with height about 1 μm are grown at 690° C. For growing structures of FIG. 5b, the Ga/N flux ratio may be gradually increased to induce lateral growth of n-type GaN nanorods and/or p-type GaN nanorods, thereby forming a quasi-continuous p-type GaN top film.

In addition, if necessary, a spin on glass (SOG) process may be performed to fill gaps between the nanorods. A liquid dielectric material or a oxide-based material may be used for this purpose.

Figure 6D:
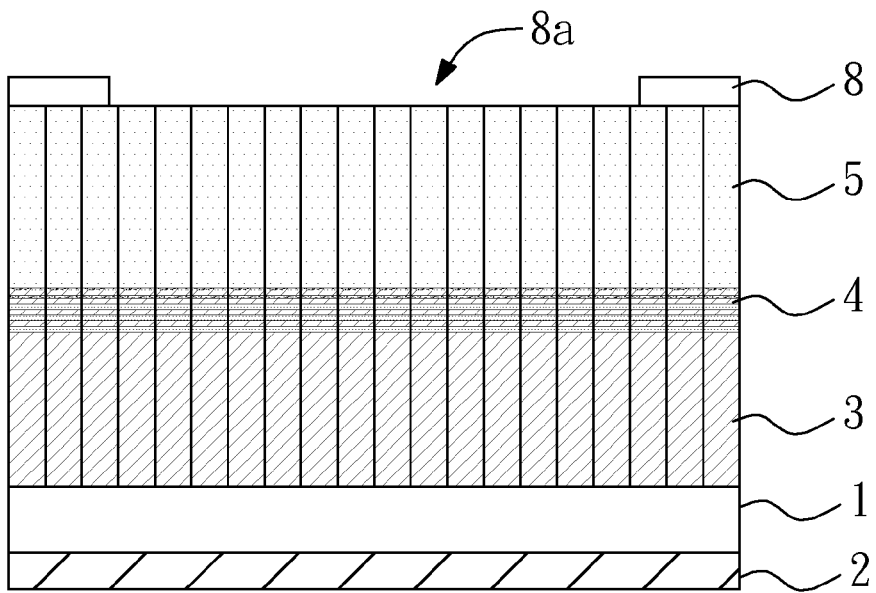

Referring to FIG. 6d, a patterned photoresist layer 8 with defined aperture 8a is formed on the second doped nanorod array 5. This step can be performed by methods known in the art, such as photolithography or E-beam lithography. For example, a photoresist layer is first coated on the second doped nanorod array 5, and then a pattern is transferred to the photoresist layer by illuminating with suitable light source, and thus apertures 8a is defined. Notice that other mask materials, such as anodic aluminum oxide (AAO) substrate, may replace the photoresist layer 8 for patterning.

Figure 6E:
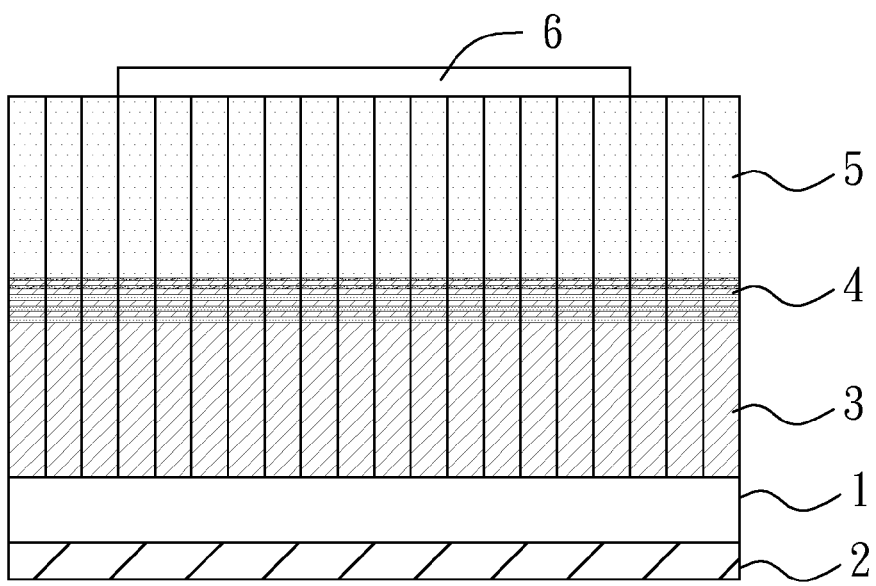

Referring to FIG. 6e, a second electrode 6 is then formed on the second doped nanorod array 5 within the aperture 8a by the mentioned evaporation method.

Figure 6F:
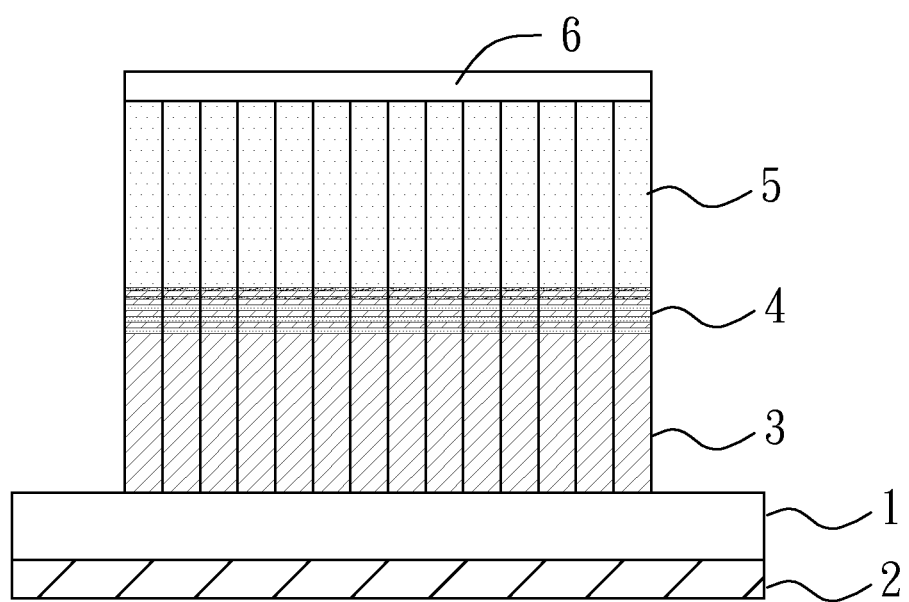

Referring to FIG. 6f, if necessary, another photoresist layer (not shown) may be formed on the second electrode 6, so as to remove unused nanorod array by a proper method, such as an etching method, preferably the inductively coupled plasma (ICP) etching method. Notice that this step may be omitted for saving cost.

The order of the method recited in FIG. 6a to FIG. 6f may be interchanged. For example, a mask may be used to define where the electroluminescent structure 3/4/5/7 is grown, so that the step of FIG. 6f can be omitted. For example, the first electrode 2 may be formed after the electroluminescent structure 3/4/5/7 is formed.

The foregoing embodiments have demonstrated several light-emitting diodes capable of emitting white or a color within full-visible-spectrum with better efficiency and flexibility, which can be used to produce various electronic devices, such as light-emitting diode displays.

Figure 7A:
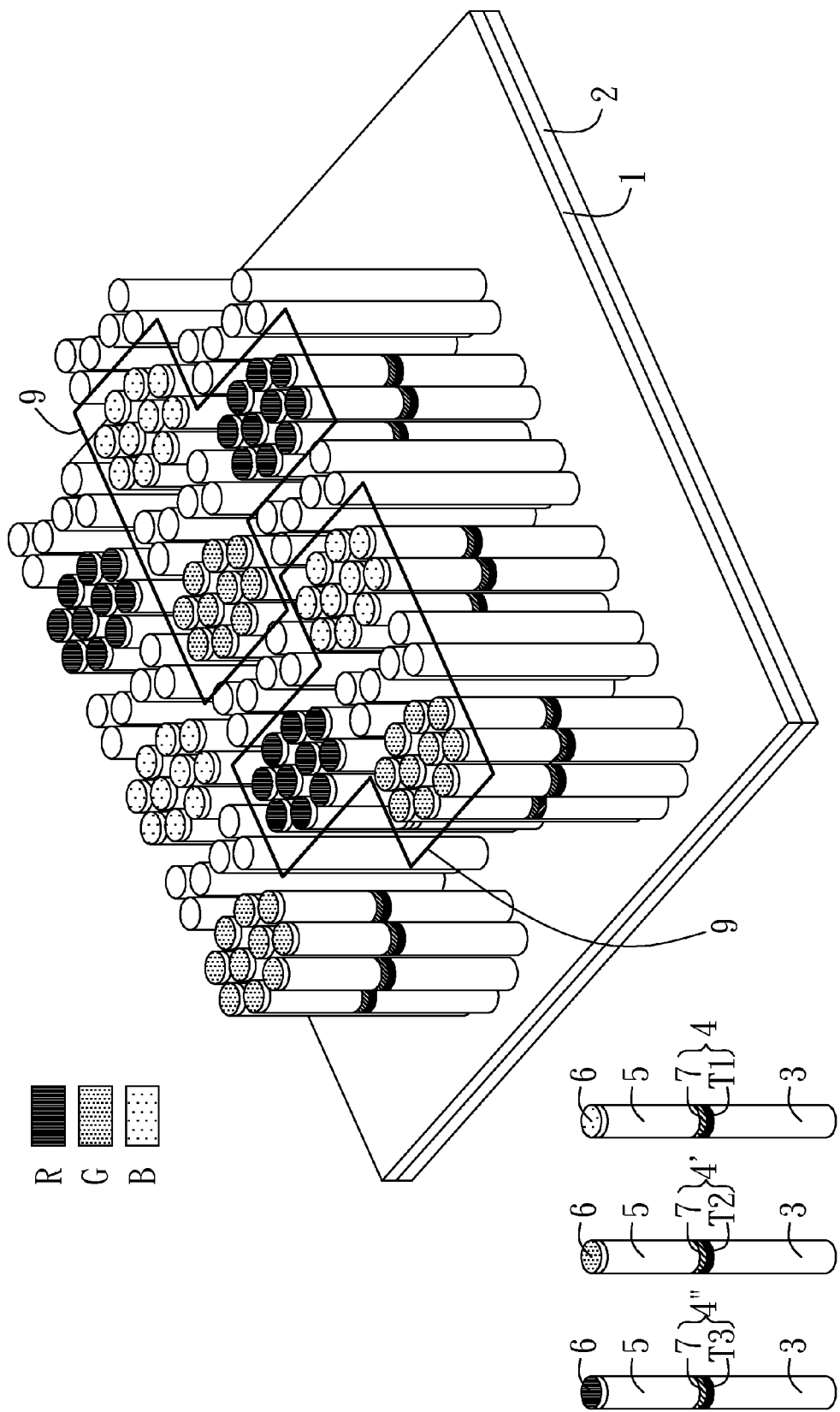
FIG. 7a and FIG. 7b are schematic diagrams of LED display according to two embodiments of the present invention.

FIG. 7a is a simplified diagram illustrating a light-emitting diode (LED) display according to a preferred embodiment of this invention. As shown in FIG. 7a, the light-emitting diode display primarily includes a plurality of pixels 9, and each pixel 9 comprises one or more first light-emitting diodes, e.g.

"B", one or more second light-emitting diodes e.g. "G", and one or more third light-emitting diodes e.g. "R", in which the first, the second, and the third light-emitting diodes B/G/R respectively emit a first, a second, and a third color, which are preferably blue, green, and red. The number of the first, second, and third light-emitting diodes B/G/R may be determined by the resolution of the LED display and typically is more than hundreds. For illustrative purpose, each pixel 9 includes about 100 red, 100 green, and 100 blue light-emitting diodes B/G/R in this embodiment.

The pixels 9 are arranged or directly formed on a substrate 1. The substrate 1 may be a conductive substrate or a non-conductive substrate coated with a conductive surface or pattern on the top surface of the substrate 1. The substrate 1 may be made of a material selected from a group consisted essentially of silicon, silicon carbide, semiconductor, plastic material, metal, glass, and combinations thereof. Each of the blue, green, and red light-emitting diodes B/G/R comprise a first doped nanorod 3, an active light-emitting region 4/4'/4" arranged on the first doped nanorod 3, a second doped nanorod 5 arranged on the active light-emitting region 4/4'/4", and a second electrode 6 arranged on the second doped nanorod 5. Further, a first electrode 2 is preferably arranged on the bottom surface of the substrate 1 for ohmic contact with the first doped nanorods 3 of all the LED diodes R/G/B via the substrate 1. The first electrode 2 is integrated in this embodiment, but in other embodiments, it may be plural and each corresponds to one first doped nanorod 3. Alternatively, as a not shown horizontal configuration, the first electrode 2 is made to be plural and are formed on the top surface for respective ohmic contact with the first doped nanorods 3 via the substrate 1.

For the illustrative purpose, the following describes the details of this preferred embodiment shown in FIG. 7*a*. The substrate 1 is a heavily n-doped silicon substrate. The first electrode 2 is a composite, multi-layered electrode, e.g., a Ti/Au electrode. The first doped nanorod 3 is an n-type gallium nitride (GaN) nanorod. The active light-emitting region 4/4'/4" includes one or more indium gallium nitride (InGaN) nanodisks, e.g., one T1 nanodisk for blue emission, one T2 nanodisk for green emission, and one T3 nanodisk for red emission. The second doped nanorod 5 is a p-type gallium nitride (GaN) nanorod. The second electrode 6 is a transparent electrode, e.g., an indium tin oxide (ITO) electrode. In addition, a GaN barrier layer 7 may be disposed between each nanodisk T1/T2/T3 and the p-type GaN nanorod 5 and between the nanodisks T1/T2/T3 for two or more nanodisks T1/T2/T3. Notice that the number of the nanodisks T1/T2/T3 may be multiple for adjusting the emission wavelength of the LED diodes, and the nanodisks T1/T2/T3 may be made of same material, e.g., InGaN, but with different thicknesses. The second electrode 6 is transparent or sufficient thin to be transparent. The nanodisks T1/T2/T3 are grown at different temperature; in this embodiment, T1 nanodisks have the highest growing temperature, T2 the second, and T3 the third. Preferably, the order to grow the nanodisks is from the highest growing temperature to the lowest growing temperature, i.e., T1, T2, and then T3. If the nanodisks are grown in the reverse order, i.e., T3, T2, and then T1, the content of indium may be unstable and thus alters the emission wavelengths of the nanodisks.

Figure 7B:
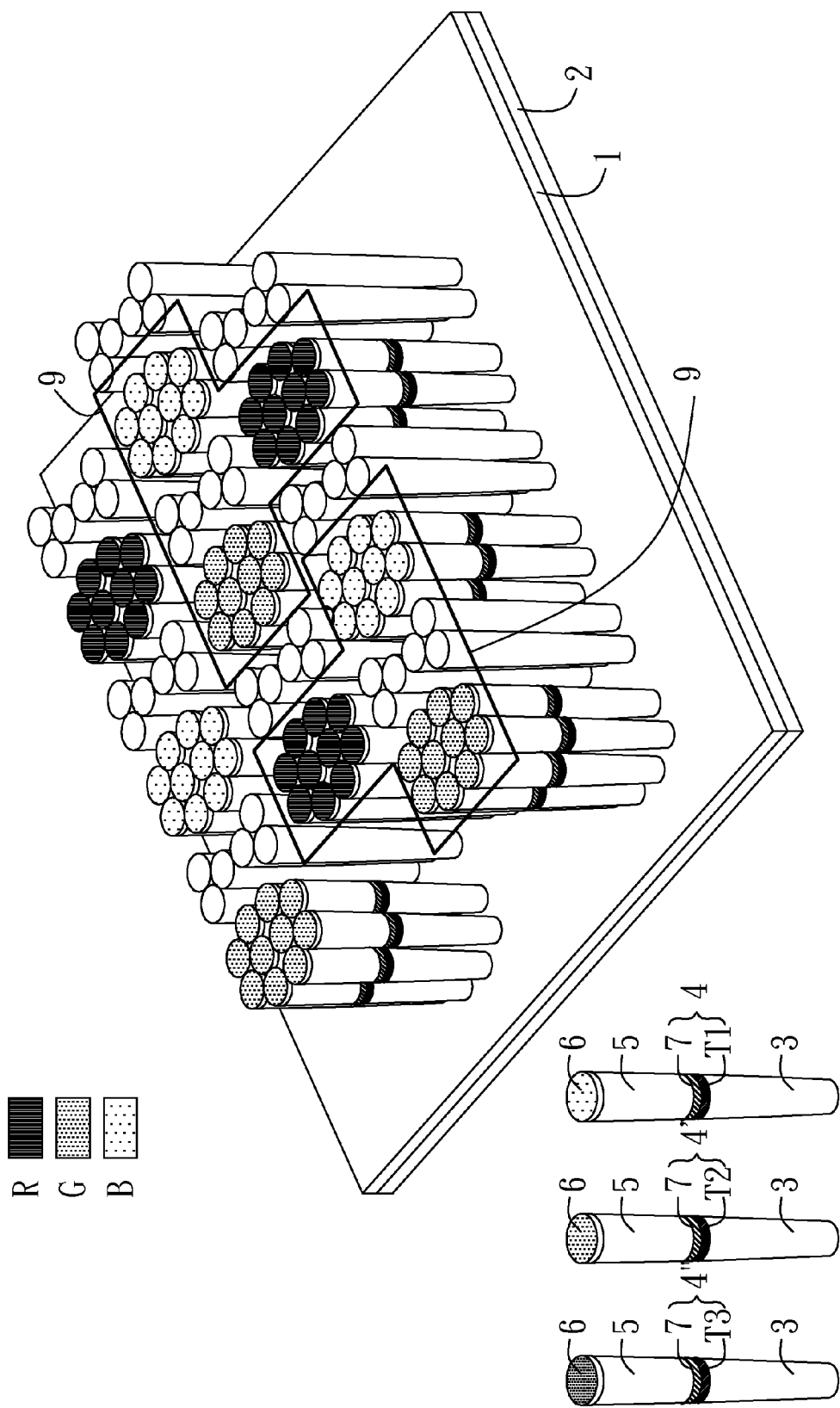

FIG. 7*b* showing a modified LED display of FIG. 7*a*, in which the p-type GaN nanorod 5 and/or the n-type GaN nanorod 3 has two ends in which the end near the second electrode 6, i.e., the first end from the second electrode 6, is wider than the other. This structure is helpful to prevent current overflow and/or prevent formation of leakage current channels.

Modifications, alternatives, and variations may be made to this embodiment. For example, each pixel 9 may further comprise one or more fourth light-emitting diodes for emitting a fourth color, one or more fifth light-emitting diodes for emitting a fifth color, and so on. The fourth color may be, but is not limited to, yellow gold. For example, the substrate 1 may be sliced to form a plurality of single packages and each comprises one or more pixels 9, and the packages are then mounted on another substrate, e.g., a printed circuit board or a flexible printed circuit board. Other modifications, alternatives, and variations may be similar to those mentioned in the forgoing embodiments.

FIG. 8*a* to FIG. 8*j* are simplified diagrams illustrating a method of this invention to fabricate a LED display as shown in FIG. 7*a*.

Figure 8A:
FIG. 8a to FIG. 8j show a method to fabricate a light-emitting diode display according to a preferred embodiment of this invention.

Referring to FIG. 8*a*, a substrate 1 is provided. The substrate 1 may include, but is not limited to, a silicon substrate, a silicon carbide (SiC) substrate, or other semiconductor substrates or other substrates made of other conducting materials. For illustrative purpose, a heavy doped n-type silicon (111) substrate 1 with resistivity 0.001-0.005 μcm is used. The substrate 1 may be cleaned by a normal procedure as known in the art. In addition, the substrate 1 may be dipped into a buffered oxide etching (BOE) solution, such as a hydrofluoric acid (HF) or ammonium fluoride ($NH_4F$) aqueous solution, for removing native oxide layer on the surface of the substrate 1.

Figure 8B:
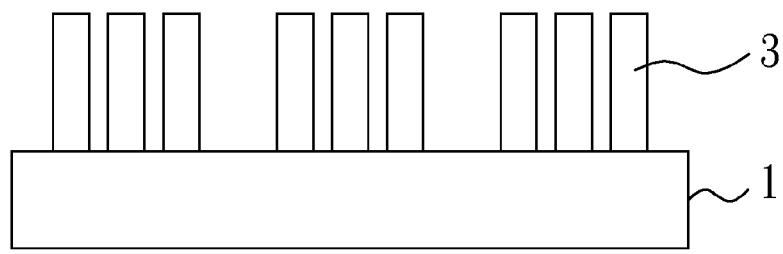

Referring to FIG. 8*b*, a plurality of first doped nanorods 3 are formed on the top surface of the substrate 1 by an epitaxial process, preferably the mentioned nitrogen-plasma-assisted molecular beam epitaxy (PAMBE). Notice that the first doped nanorods 3 may be formed on selected area of the substrate 1 by a mask, or formed on essentially whole area of the substrate 1. In this embodiment, the first doped nanorods 3 are n-type gallium nitride (GaN) nanorods.

Figure 8C:
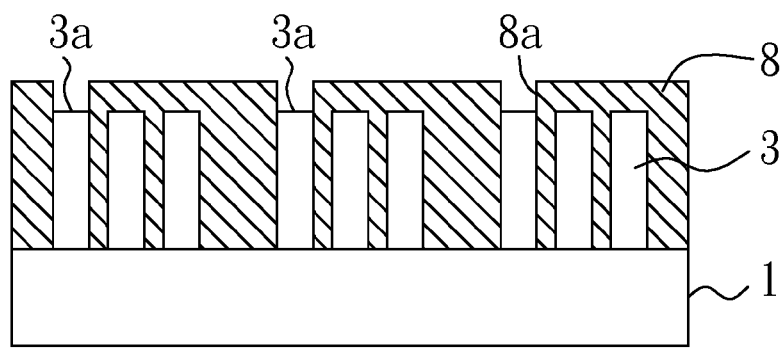

Referring to FIG. 8*c*, a first mask 8 with defined apertures 8*a* is arranged or formed on the first doped nanorods 3, exposing a plurality of first top surfaces 3*a* of selected first doped nanorods 3. The first mask 8 may be a patterned photoresist layer or other mask materials, such as silicon dioxide, anodic aluminum oxide (AAO), and titanium, etc. Taking the patterned photoresist layer 8 as an example, it can be formed by methods known in the art, such as photolithography or electron-beam lithography. For example, a photoresist layer is first coated on the first doped nanorods 3, and then a pattern is transferred to the photoresist layer by exposing to a suitable light source, and thus apertures 8*a* are defined.

Figure 8D:
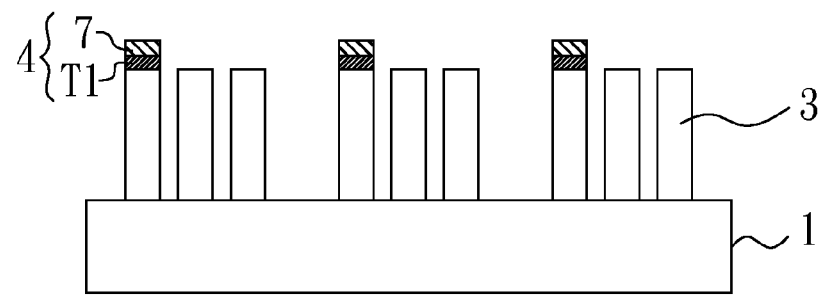

Referring to FIG. 8*d*, a plurality of first active light-emitting regions 4 are respectively formed on the first top surfaces 3*a* of the first doped nanorods 3 by using the epitaxial process mentioned in FIG. 8*b*. Each of the first light-emitting regions 4 comprises one or more nanodisks. In this embodiment, each first light-emitting region 4 comprises a mentioned T1 nanodisk and a mentioned barrier layer 7 for emitting blue color. The first mask 8 is then removed or stripped by an etching (e.g., BOE) solution.

Figure 8E:
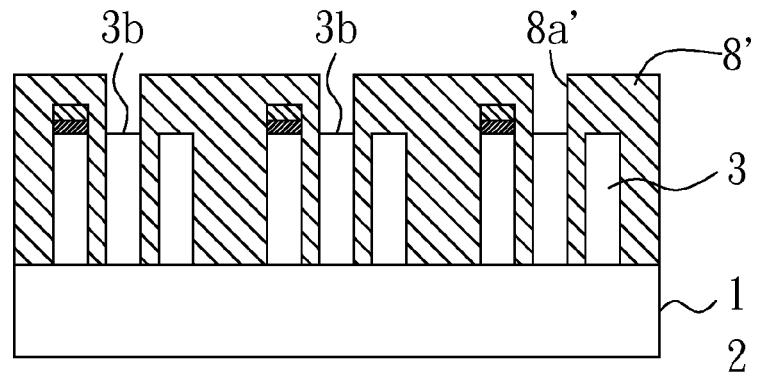

Referring to FIG. 8*e*, a second mask 8' with defined apertures 8*a'* is arranged or formed on the first doped nanorods 3, exposing a plurality of second top surfaces 3*b* of selected first doped nanorods 3. The second mask 8' may be essentially the same as the first mask 8 except the locations of the aperture 8*a'*.

Figure 8F:
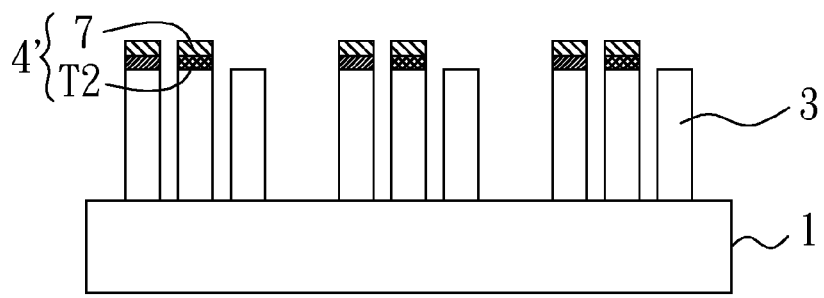

Referring to FIG. 8*f*, a plurality of second active light-emitting regions 4' are respectively formed on the second top surfaces 3b of the first doped nanorods 3 by using the epitaxial process mentioned in FIG. 8b. Each second active light-emitting regions 4' comprises one or more nanodisks. In this embodiment, each second active light-emitting region 4' comprises a mentioned T2 nanodisk and a mentioned barrier layer 7 for emitting green color. The second mask 8' is then removed or stripped by the buffered oxide etching (BOE) solution.

Figure 8G:
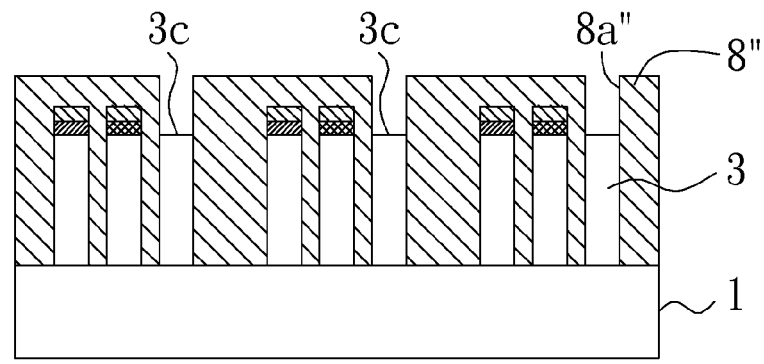

Referring to FIG. 8g, a third mask 8" with defined apertures 8a" is arranged or formed on the first doped nanorods 3, exposing a plurality of third top surfaces 3c of selected first doped nanorods 3. The third mask 8" may be essentially the same as the first mask 8 except the positions of the aperture 8a".

Figure 8H:
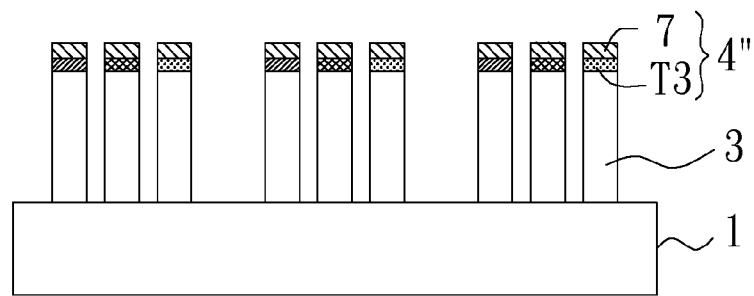

Referring to FIG. 8h, a plurality of third active light-emitting regions 4" are respectively formed on the third top surfaces 3c of the first doped nanorods 3 by using the epitaxial process mentioned in FIG. 8b. Each third active light-emitting regions 4" comprises one or more nanodisks. In this embodiment, each third active light-emitting region 4" comprises a mentioned T3 nanodisk and a mentioned barrier layer 7 for emitting red color. The third mask 8" is then removed or stripped by the buffered oxide etching (BOE) solution.

Figure 8I:
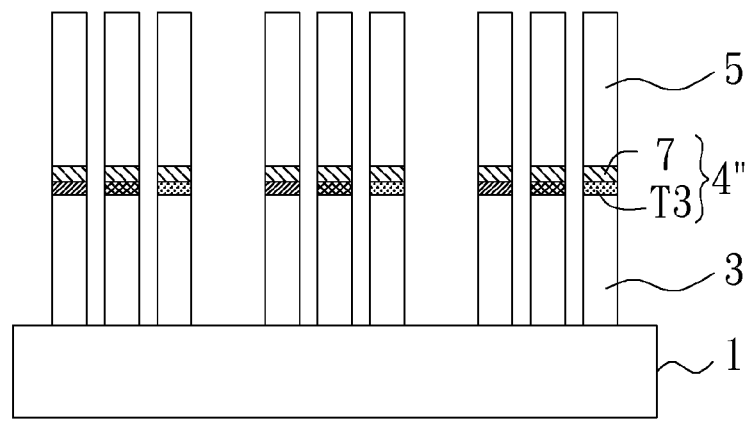
Figure 8J:
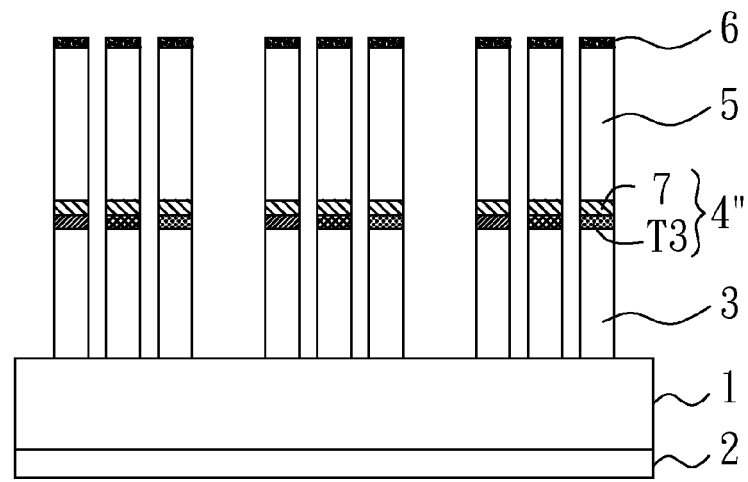

Referring to FIG. 8i, a plurality of second doped nanorods 5 are respectively formed on the top surfaces of the first, second, and third active light-emitting regions 4/4'/4" by using the mentioned epitaxial process. In this embodiment, the second doped nanorods 5 are p-type gallium nitride (GaN) nanorods. Referring to FIG. 8j, a first electrode 2, such as a Ti/Au electrode 2, is formed on the bottom surface of the substrate 1 by an evaporation method, such as thermal evaporation, electron-beam evaporation, sputtering, or other methods known in the art. Then, a plurality of second electrodes 6 are formed on the top surfaces of the second doped nanorods 5 by a self-aligned manner.

The PAMBE process used in this embodiment may have essentially same features as mentioned in the foregoing embodiments. The PAMBE process is performed under nitrogen-rich conditions, in comparison to the group-III/nitrogen flux ratio used for III-nitride film growth. The nitrogen plasma source during the growth procedure is at a nitrogen gas flow rate of 3 sccm under 500 W RF forward power. The grown nanorods are wurtzite-type single crystals, i.e., the nanorod axial growth direction is along the wurtzite c-axis. The in-plane crystallographic axes of the nanorods are found to be the following epitaxial relation: $<2\overline{1}\overline{1}0>\|[\overline{1}10]_{Si}$; $<1\overline{1}00>\|[11\overline{2}]_{Si}$. The Si-doped n-type GaN nanorods is about have a height about 1 μm with a growth temperature 770° C. and a Ga beam equivalent pressure (BEP$_{Ga}$) 9×10$^{-8}$ Torr. Subsequently, InGaN nanodisks are grown on top of the n-type GaN nanorods. The emission wavelengths of InGaN nanodisks are controlled by the growth temperature (T) and group-III beam fluxes. In the exemplary example of FIG. 7a and FIG. 7b, the growth temperature of the nanodisks T$_1$/T$_2$/T$_3$ are 705° C., 700° C., and 690° C. repestively and the growing conditions are: T$_1$ nanodisk (BEP$_{Ga}$: 7.5×10$^{-8}$ Torr; BEP$_{In}$: 2.6×10$^{-8}$ Torr; thickness of InGaN/GaN: ~25 nm/25 nm), T$_2$ nanodisk (BEP$_{Ga}$: 6.2×10$^{-8}$ Torr; BEP$_{In}$: 3.3×10$^{-8}$ Torr; thickness of InGaN/GaN: ~10 nm/25 nm), and T$_3$ nanodisk (BEP$_{Ga}$: 5.7×10$^{-8}$ Torr; BEP$_{In}$: 3.7×10$^{-8}$ Ton; thickness of InGaN/GaN ~15 nm/25 nm). The thickness of each InGaN nanodisk may range from 10 nm to 25 nm and the thickness of the GaN barrier 7 is about 25 nm, as shown schematically in FIG. 7a and FIG. 7b. On top of the T$_3$ InGaN nanodisk, Mg-doped p-type GaN nanorods with height about 1 μm are grown at 690° C. For growing structures of FIG. 7b, the Ga/N flux ratio may be gradually increased to induce lateral growth of n-type GaN nanorods and/or p-type GaN nanorods, thereby forming a quasi-continuous p-type GaN top film.

In addition, if necessary, a spin on glass (SOG) process may be performed to fill gaps between the nanorods within a sub-pixel, i.e., between nanorods for emitting a same color within a pixel. A liquid dielectric material or an oxide-based material may be used for this purpose.

If necessary, another mask (not shown) may be formed on the second electrode 6, so as to remove unused nanorods by etching, such as the inductively coupled plasma (ICP) etching method. This step may be omitted for simplicity.

The order of the method recited in FIG. 8a to FIG. 8j may be interchanged. For example, the first electrode 2 may be formed after the light-emitting diodes R/G/B are formed. Additionally, a mask may be used to define where the first, second, and third light-emitting diodes B/G/R are grown, so that the ICP etching is unnecessary. Moreover, additional steps may follow to this method. For example, the substrate 1 may be sliced to form a plurality of single packages and each comprises one or more pixels 9, and the packages are then mounted on another substrate, e.g., a printed circuit board or a flexible printed circuit board. For example, the first, second, and third light-emitting diodes B/G/R may be transferred to one or more substrates for other purposes.

The above method illustrates how to fabricate a light-emitting diode display with three primary color, namely red, green, and blue. However, it can be analog to fabricate an LED display with more primary colors, e.g., four primary colors. For the four primary colors case, an additional mask with defined apertures is arranged or formed on the first doped nanorods 3 to expose a plurality of fourth top surfaces of selected first doped nanorods, a fourth active light-emitting region is then formed on each of the fourth top surfaces, and a second doped nanorod is formed on each of the fourth active light-emitting region.

Figure 9:
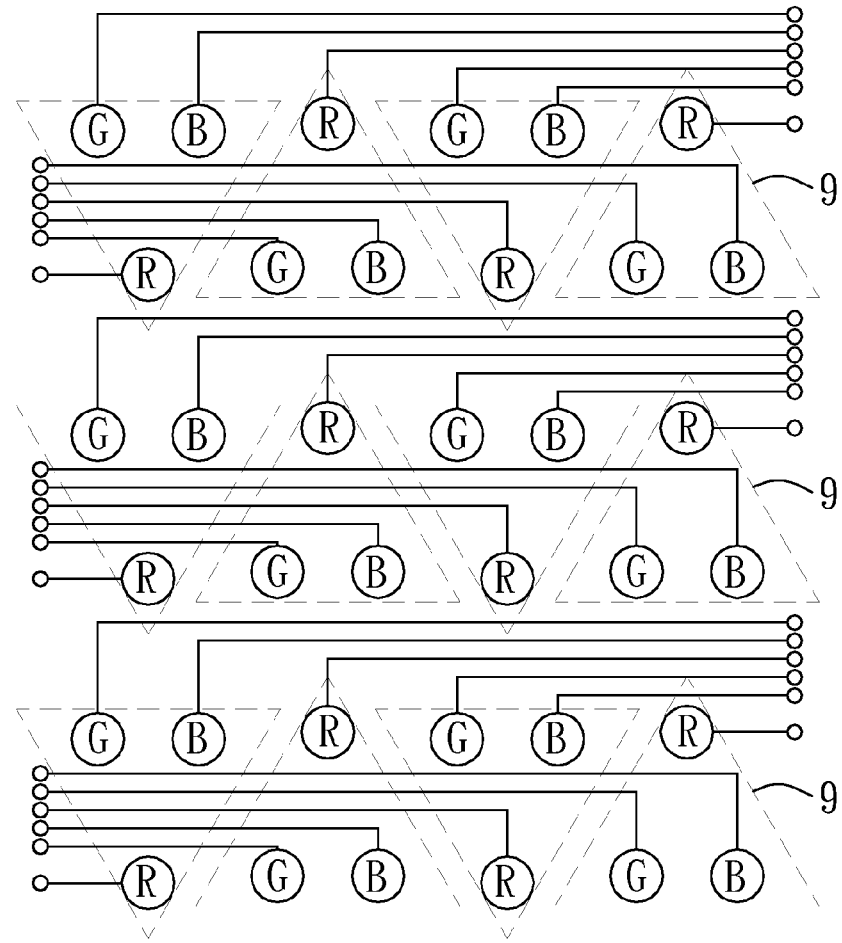
FIG. 9 shows a driving configuration and method for the LED displays of this invention.

FIG. 9 is a simplified diagram showing a driving method of the LED displays of this invention. As shown in FIG. 9, each pixel 9 comprises three sub-pixels, namely red (R), green (G), and blue (B) sub-pixels, and each sub-pixel comprises one or more LEDs for emitting a same color. The first electrode of the sub-pixels R/G/B is a common electrode while the second electrodes of the sub-pixels are separately connected to at least one signal source. The signal source separately provides desired voltages to sub-pixels of each pixel, and a color image is displayed according to the combination of emissions from these three types of sub-pixels.

Accordingly, this invention provides LED displays with simple structure and fabricating method. All light-emitting diodes emitting different wavelengths can be grown on the same substrate, and the growth substrate may be used also as the display substrate. The fabrication methods of this invention can omit those complicated steps for transferring the light-emitting diodes and thus provide a more reliable and cost-down approach.

Although specific embodiments have been illustrated and described, it will be appreciated by those skilled in the art that various modifications may be made without departing from the scope of the present invention, which is intended to be limited solely by the appended claims.

What is claimed is:
1. A light-emitting diode display, comprising:
a substrate;
a plurality of pixels, arranged on the substrate, each pixel comprising:
a first sub-pixel, comprising one or more first light-emitting diodes for emitting a blue color;

a second sub-pixel, comprising one or more second light-emitting diodes for emitting a green color; and a third sub-pixel, comprising one or more third light-emitting diodes for emitting a red color;

wherein each of the first, second, and third light-emitting diode comprises:

a first electrode;

a first doped nanorod, in ohmic contact with the first electrode;

an active light-emitting region arranged on the first doped nanorod;

a second doped nanorod arranged on the active light-emitting region; and a second electrode arranged on the second doped nanorod;

wherein each of the active light-emitting regions of the first, second, and third light-emitting diodes is made from a group III nitride semiconductor system, and a full-width at half maximum of the blue, green, and red color in a photon energy scale is less than 190 meV.

2. The light-emitting diode display as recited in claim 1, wherein the substrate is the same substrate used for growing the first, second, and third light-emitting diodes.

3. The light-emitting diode display as recited in claim 1, wherein the first electrodes of the first, second, and third light-emitting diodes are integrally formed as a common electrode, and a common voltage is supplied to the common electrode.

4. The light-emitting diode display as recited in claim 3, wherein voltages are separately supplied to the second electrodes of the first, second, and third light-emitting diodes of each pixel.

5. The light-emitting diode display as recited in claim 1, wherein the first doped nanorod is n-type gallium nitride-based (GaN-based) nanorod, the second doped nanorod is p-type gallium nitride-based (GaN-based) nanorod, the active light-emitting region comprises one or more indium gallium nitride-based (InGaN-based) nanodisks, and each indium gallium nitride (InGaN) nanodisk has a thickness equal to or more than 10 nm.

6. The light-emitting diode display as recited in claim 1, wherein the active light-emitting region of the first light-emitting diodes comprises a GaN barrier and a blue-emitting InGaN-based nanodisk.

7. The light-emitting diode display as recited in claim 1, wherein the active light-emitting region of the second light-emitting diodes comprises a GaN barrier and a green-emitting InGaN-based nanodisk.

8. The light-emitting diode display as recited in claim 1, wherein the active light-emitting region of the third light-emitting diodes comprises a GaN barrier and a red-emitting InGaN-based nanodisk.

9. The light-emitting diode display as recited in claim 1, wherein the active light-emitting region of the first, second, or third light-emitting diodes comprise two or more InGaN-based nanodisks, and GaN barriers are interposed between the InGaN-based nanodisks.

10. The light-emitting diode display as recited in claim 1, wherein the substrate is a silicon substrate.

11. The light-emitting diode display as recited in claim 1, wherein the substrate is made of a material selected from a group consisted essentially of silicon carbide, semiconductor, plastics, metal, glass, and combinations thereof.

12. The light-emitting diode display as recited in claim 1, wherein each pixel further comprises a fourth sub-pixel comprising one or more fourth light-emitting diodes for emitting a fourth color.

13. The light-emitting diode display as recited in claim 1, wherein each of the first doped nanorods and the second doped nanorods has two ends in which the first end from the second electrode is wider than the other.

14. A method for producing a light-emitting diode display, comprising the steps of:

providing a conductive substrate;

forming a plurality of first doped nanorods on the substrate;

forming an integral first electrode or a plurality of individual first electrodes for in ohm contact with the first doped nanorods via the conductive substrate;

forming a first active light-emitting region on each of a plurality of first top surfaces of the first doped nanorods;

forming a second active light-emitting region on each of a plurality of second top surfaces of the first doped nanorods;

forming a third active light-emitting region on each of a plurality of third top surfaces of the first doped nanorods;

forming a second doped nanorod on each of the first, second, and third light-emitting regions; and forming a second electrode on each second doped nanorod;

wherein the first, second, and third light-emitting region respectively emit a first, a second, and a third color when voltages are supplied to the integral first electrode or the plurality of first electrodes and supplied to the second electrode.

15. The method as recited in claim 14, wherein the integral first electrode is formed on the bottom surface of the substrate.

16. The method as recited in claim 14, wherein the plurality of first electrodes are formed on the top surface of the substrate.

17. The method as recited in claim 14, wherein the conductive substrate is a silicon substrate or a conductive semiconductor substrate.

18. The method as recited in claim 14, wherein the first doped nanorods are n-type gallium nitride-based (GaN-based) nanorods, the second doped nanorods are p-type gallium nitride-based (GaN-based) nanorods, and each of the first, second, and third active light-emitting regions comprises one or more indium gallium nitride-based (InGaN-based) nanodisks.

19. The method as recited in claim 18, wherein the n-type or p-type gallium nitride-based (GaN-based) nanorods are wurtzite-type single crystals in which the axial growth direction of the nanorods is along the wurtzite c-axis.

20. The method as recited in claim 14, wherein the first doped nanorods, the second doped nanorods, and the first, second, and third active light-emitting regions are formed by a nitrogen-plasma-assisted molecular beam epitaxy method performed under nitrogen-rich conditions in comparison to a group-III/nitrogen flux ratio used for an III-nitride film growth.

21. The method as recited in claim 20, wherein each of the first, second, and third active light-emitting regions comprises one or more indium gallium nitride-based (InGaN-based) nanodisks, and their emitting wavelength and intensity are controlled by the growth temperatures and thickness of the nanodisks, respectively.

22. The method as recited in claim 20, if forming two or more InGaN-based nanodisks, a GaN barrier is further formed between each two of the InGaN-based nanodisks.

23. The method as recited in claim 20, when growing the second doped nanorod and/or the first doped nanorods, the group-III/nitrogen flux ratio is gradually increased to induce lateral growth, such that each of the second doped nanorods and/or the first doped nanorods has two ends in which the first end from the second electrode is wider than the other.

24. The method as recited in claim 14, further comprising:
forming a fourth active light-emitting region on each of a plurality of fourth top surfaces of the first doped nanorods;
forming a second doped nanorod on each of the fourth active light-emitting region;
whereby the fourth light-emitting region emits a fourth color when voltages are supplied to the integral first electrode or the plurality of first electrodes and supplied to the second electrode.

25. A light-emitting diode display, comprising:
a substrate;
a plurality of pixels, arranged on the substrate, each pixel comprising:
a first sub-pixel, comprising one or more first light-emitting diodes for emitting a first color;
a second sub-pixel, comprising one or more second light-emitting diodes for emitting a second color; and
a third sub-pixel, comprising one or more third light-emitting diodes for emitting a third color;
wherein each of the first, second, and third light-emitting diode comprises:
a first electrode;
a first doped gallium nitride (GaN) nanorod ohmic contacting with the first electrode nanorod;
an active light-emitting region comprising one or more indium gallium nitride (InGaN) nanodisks disposed on the first doped GaN nanorods, wherein each indium gallium nitride (InGaN) nanodisk has a thickness equal to or more than 10 nm;
a second doped GaN nanorod arranged on the active light-emitting region; and
a second electrode arranged on the second doped nanorod.

\* \* \* \* \*